US010941926B2

(12) United States Patent
Martin

(10) Patent No.: US 10,941,926 B2
(45) Date of Patent: Mar. 9, 2021

(54) MODULAR LIGHTING SYSTEM INCLUDING LIGHT MODULES WITH INTEGRATED LED UNITS

(71) Applicant: Applied Electronic Materials, LLC, Fort Wayne, IN (US)

(72) Inventor: Tom Martin, Fort Wayne, IN (US)

(73) Assignee: Applied Electronic Materials, LLC, Fort Wayne, IN (US)

(*) Notice: Subject to any disclaimer, the term of this patent is extended or adjusted under 35 U.S.C. 154(b) by 0 days.

(21) Appl. No.: 16/781,275

(22) Filed: Feb. 4, 2020

(65) Prior Publication Data

US 2020/0173639 A1   Jun. 4, 2020

Related U.S. Application Data

(63) Continuation-in-part of application No. 16/221,983, filed on Dec. 17, 2018, which is a (Continued)

(51) Int. Cl.
*F21S 8/04* (2006.01)
*F21V 21/35* (2006.01)
(Continued)

(52) U.S. Cl.
CPC .............. *F21V 21/35* (2013.01); *F21S 8/043* (2013.01); *F21V 29/503* (2015.01); *F21V 29/70* (2015.01); *F21S 2/005* (2013.01); *F21S 8/026* (2013.01); *F21Y 2103/10* (2016.08); *F21Y 2115/10* (2016.08)

(58) Field of Classification Search
CPC ......... H01R 33/94; F21V 21/34; F21V 21/35; F21V 21/005; F21V 23/06; F21S 2/005; F21Y 2115/10; F21Y 2103/10; E04B 9/32; E04B 9/064; H05K 1/00
See application file for complete search history.

(56) References Cited

U.S. PATENT DOCUMENTS 6,428,189 B1   8/2002   Hochstein
8,177,385 B2   5/2012   Porciatti
(Continued)

OTHER PUBLICATIONS

Office Action dated Jul. 9, 2018 in corresponding U.S. Appl. No. 15/382,091.

*Primary Examiner* — Zheng Song
(74) *Attorney, Agent, or Firm* — Faegre Drinker Biddle & Reath LLP

(57) ABSTRACT

Lighting systems for use in building interiors, for example, which include a plurality of light modules each having an elongate substrate with a lower surface, and electrical circuitry including a plurality of LED units printed to the lower surface via thick film techniques. Each light module is formed as a single-component, packaged construct for easy installation, and facilitates conductive transfer of heat away from the LEDs for enhanced power efficiency. The light modules may be releasably connected to, and extend from, an elongate spine unit which provides structural support and power input to the light modules and optionally, the system may employ use of metallic components, such as the metallic substrate of a light module, for directly conducting current to power the LED units.

15 Claims, 27 Drawing Sheets

Related U.S. Application Data continuation-in-part of application No. 16/149,703, filed on Oct. 2, 2018, which is a continuation-in-part of application No. 15/382,091, filed on Dec. 16, 2016, now abandoned.

(60) Provisional application No. 62/269,466, filed on Dec. 18, 2015, provisional application No. 62/363,715, filed on Jul. 18, 2016, provisional application No. 62/568,450, filed on Oct. 5, 2017, provisional application No. 62/660,606, filed on Apr. 20, 2018.

(51) Int. Cl.

| | | |
|---|---|---|
| *F21V 29/503* | (2015.01) | |
| *F21V 29/70* | (2015.01) | |
| *F21Y 115/10* | (2016.01) | |
| *F21Y 103/10* | (2016.01) | |
| *F21S 2/00* | (2016.01) | |
| *F21S 8/02* | (2006.01) | |

(56) References Cited

U.S. PATENT DOCUMENTS

| | | |
|---|---|---|
| 8,876,963 B2 | 11/2014 | Cruz et al. |
| 8,884,277 B2 | 11/2014 | Konig et al. |
| 2004/0095782 A1* | 5/2004 | Isoda ............... F21V 29/70 362/555 |
| 2006/0043382 A1* | 3/2006 | Matsui ............... H01L 25/0753 257/79 |
| 2009/0244909 A1* | 10/2009 | Chen ............... F21V 29/763 362/368 |
| 2010/0149823 A1 | 6/2010 | Happoya |
| 2011/0026238 A1 | 2/2011 | Kim |
| 2012/0314369 A1 | 12/2012 | Wu |
| 2013/0170211 A1 | 7/2013 | Lin |
| 2013/0182422 A1 | 7/2013 | Guilmette |
| 2013/0308303 A1 | 11/2013 | Greenholt et al. |
| 2014/0226316 A1 | 8/2014 | Medendorp et al. |
| 2014/0362570 A1 | 12/2014 | Miyoshi et al. |
| 2014/0369042 A1 | 12/2014 | Hsu |
| 2014/0369045 A1 | 12/2014 | Yu et al. |
| 2015/0241035 A1 | 8/2015 | Dankelmann et al. |
| 2015/0330618 A1 | 11/2015 | McDermott |
| 2015/0330620 A1 | 11/2015 | Huang |
| 2016/0095200 A1 | 3/2016 | Au |
| 2016/0201883 A1 | 7/2016 | Sorensen et al. |
| 2017/0051904 A1 | 2/2017 | Tsai et al. |
| 2017/0062688 A1 | 3/2017 | Zhu et al. |
| 2017/0082270 A1 | 3/2017 | Klase et al. |
| 2017/0175961 A1 | 6/2017 | Martin |
| 2017/0175962 A1 | 6/2017 | Kim et al. |
| 2017/0175988 A1 | 6/2017 | Jeon |
| 2019/0041048 A1 | 2/2019 | Martin et al. |
| 2019/0101249 A1 | 4/2019 | Ulloa et al. |
| 2019/0120444 A1 | 4/2019 | Martin et al. |
| 2019/0383475 A1 | 12/2019 | Deng |

\* cited by examiner

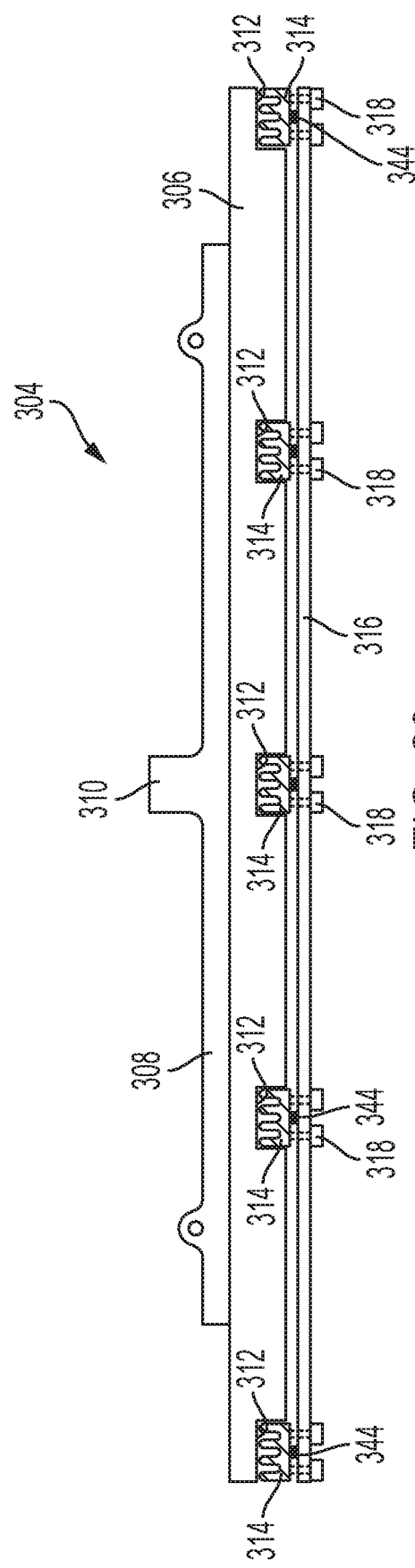

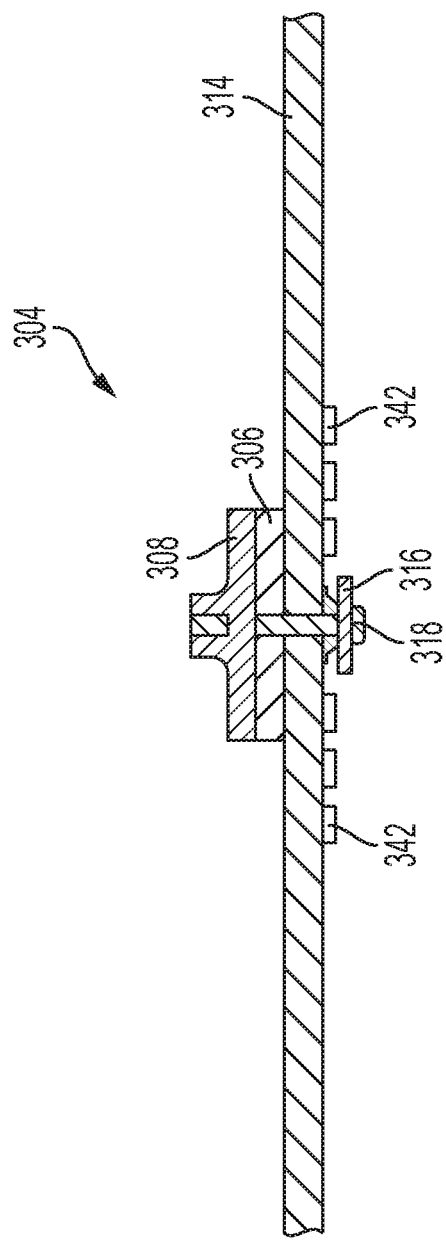

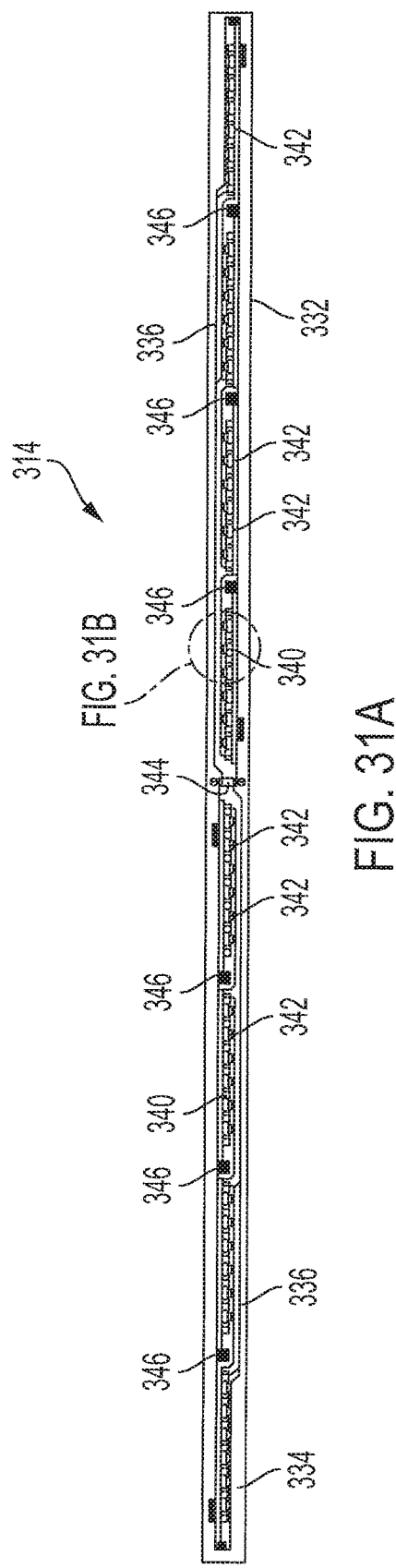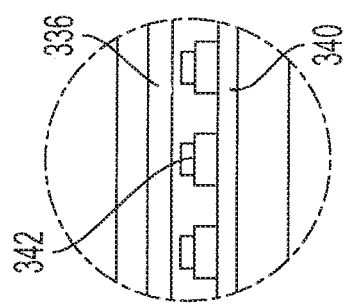
FIG. 31A
FIG. 31B

MODULAR LIGHTING SYSTEM INCLUDING LIGHT MODULES WITH INTEGRATED LED UNITS

CROSS-REFERENCE TO RELATED APPLICATIONS

This application is a Continuation-in-Part of U.S. patent application Ser. No. 16/221,983, filed Dec. 17, 2018, which is a Continuation-in-Part of U.S. patent application Ser. No. 16/149,703, filed Oct. 2, 2018, which is a Continuation-in-Part of U.S. patent application Ser. No. 15/382,091, filed Dec. 16, 2016, which claims priority to U.S. Provisional Patent Application Ser. No. 62/269,466, filed Dec. 18, 2015, and U.S. Provisional Patent Application Ser. No. 62/363,715, filed Jul. 18, 2016, and wherein U.S. patent application Ser. No. 15/382,091 also claims priority under 35 U.S.C. § 119(e) of U.S. Provisional Patent Application Ser. No. 62/568,450, filed Oct. 5, 2017, and U.S. Provisional Patent Application Ser. No. 62/660,606, filed Apr. 20, 2018. The disclosures of each of the foregoing applications are hereby incorporated by reference herein in their entirety.

BACKGROUND

1. Field of the Disclosure

The present disclosure relates to lighting systems, such as those used in building interiors or for exterior lighting, for example. In one embodiment, the present disclosure relates to a lighting system including light modules which may be releasably and/or adjustably connected to one another to form a lighting array.

2. Description of the Related Art

Interior building spaces, particularly commercial or working spaces, are often provided with a suspended or "drop" ceiling which is formed by a grid of structural components that are connected to one another and suspended at a desired height below a permanent, structural ceiling. The structural grid is often made of connected metallic components, with ceiling tiles disposed within the grid spaces between the structural components. The ceiling tiles together provide a heat insulating layer to separate the space above the suspended ceiling from the working space below, wherein the space above the ceiling is often subjected to undesirably hot or cool temperatures as opposed to the temperatures in the working space, which are more closely controlled by the HVAC system of the building.

One typical lighting arrangement involves the use of fluorescent light modules, which are connected to the grid structure and disposed in spaces between the ceiling tiles. Another typical arrangement involves the use of light emitting diode (LED) modules, which may also be connected to the grid structure and disposed in spaces between ceiling tiles.

In still another arrangement, LED modules that include separate structural housings containing LED components and their associated control circuitry may be attached directly to the grid members via a mechanical connection, in which the LED modules are disposed in-line with the grid structure itself between the edges of the suspended ceiling tiles. One advantage of this configuration is that the ceiling grid structures themselves may function to conductively convey heat away from the LED modules into the space above the suspended ceiling. However, a disadvantage of this configuration is that the LED modules are manufactured separately from the grid structures and therefore are typically expensive to purchase and install. Also, heat removal from the LED modules may be inefficient, compromising the electrical efficiently of the LED modules. Further, the LED modules may be somewhat large and bulky in size, contributing to an increased overall visual exposure of the grid structure.

What is needed is an improvement over the foregoing.

SUMMARY

The present disclosure relates to lighting systems for use in building interiors, for example, which include a plurality of light modules each having an elongate substrate with a lower surface, and electrical circuitry including a plurality of LED units mounted to the lower surface. Each light module is formed as a single-component, packaged construct for easy installation, and facilitates conductive transfer of heat away from the LEDs for enhanced power efficiency. In one embodiment, the light modules are releasably connected to, and extend from, an elongate spine unit which provides structural support and power input to the light modules. In another embodiment, the light modules are disposed parallel to one another and are connected by a series of lateral connectors in laterally spaced relation to one another, with the light modules adjustably mounted to the lateral connectors whereby the spacing between the light modules may be varied.

As discussed below, one application of the lighting assemblies disclosed herein is for use in plant growing facilities, such as greenhouses, hothouses, or hydroponics or aquaponics facilities, for example. The lighting assemblies may be used to provide primary light for plant growth in the absence of natural light or may be used to provide supplemental light for plant growth if natural light is limited, such as in a greenhouse during a cloudy day or in temperate zones or high latitude locations.

In one form thereof, the present disclosure provides A modular lighting assembly, including an elongate spine unit electrically connected to a source of electric current and having a plurality of connecting interfaces; a light module releasably connected to a connecting interface of the spine unit, the light module including an elongate metallic substrate; an electrically insulating layer deposited on the substrate; an electrically conductive circuit layer deposited on the insulating layer; and a plurality of LED units electrically connected to the circuit layer; and a bus bar connected to the spine unit and including a metallic substrate in electrical contact with the source of electric current and with the circuit layer of the light module.

In another form thereof, the present invention provides a modular lighting assembly, including an elongate spine unit electrically connected to a source of electric current and having a plurality of connecting interfaces; a bus bar connected to the spine unit, the bus bar including a metallic substrate; an electrically insulating layer deposited on the substrate; an electrically conductive circuit layer deposited on the insulating layer and in electrical contact with the source of electric current; and a light module releasably retained to the spine unit by the bus bar, the light module including an elongate metallic substrate in electrical contact with the bus bar circuit layer; and a plurality of LED units mounted to the light module and in electrical contract with the light module substrate.

BRIEF DESCRIPTION OF THE DRAWINGS

The above-mentioned and other features of the disclosure, and the manner of attaining them, will become more apparent and will be better understood by reference to the following description of embodiments of the disclosure taken in conjunction with the accompanying drawings, wherein:

FIG. 29 is a first sectional view of the spine unit of the lighting assembly of FIG. 27, taken along line 29-29 of FIG. 27;

FIG. 30 is a second sectional view of the spine unit of the lighting assembly of FIG. 27, taken along line 30-30 of FIG. 27;

FIG. 31A is a bottom view of a light module of the lighting assembly of FIG. 27; and FIG. 31B is a fragmentary view of a portion of FIG. 31A.

Corresponding reference characters indicate corresponding parts throughout the several views. The exemplifications set out herein illustrate embodiments of the disclosure and such exemplifications are not to be construed as limiting the scope of the disclosure in any manner.

DETAILED DESCRIPTION

Although the present disclosure has been described in detail herein in connection with an exemplary embodiment of a light module for use as a component of a ceiling grid system for a building interior, the teachings of the present disclosure are more broadly applicable for light modules in general, including both interior and exterior lighting systems, in which thick film techniques are employed to provide layers directly onto a heat conductive substrate which forms a foundational substrate or structural component of the light module.

For example, light modules made according to the teachings herein could be used for high-volume lighting applications of the type in which a large number of LEDs are provided on circuit layers deposited over electrically insulating layers which are in turn deposited over heat conductive substrates of light modules. These light modules may be combined with a large number of like light modules into banks of light modules which are capable of use with other banks of light modules to light large interior spaces, such as stadiums, convention centers, warehouses, or factory spaces, for example. In other embodiments, light modules constructed in accordance with present teachings may be used for exterior lighting such as flood lights, display signs, street lights, or traffic or other signaling lights, or in mobile applications such as automotive or other vehicular lighting.

Figure 1:
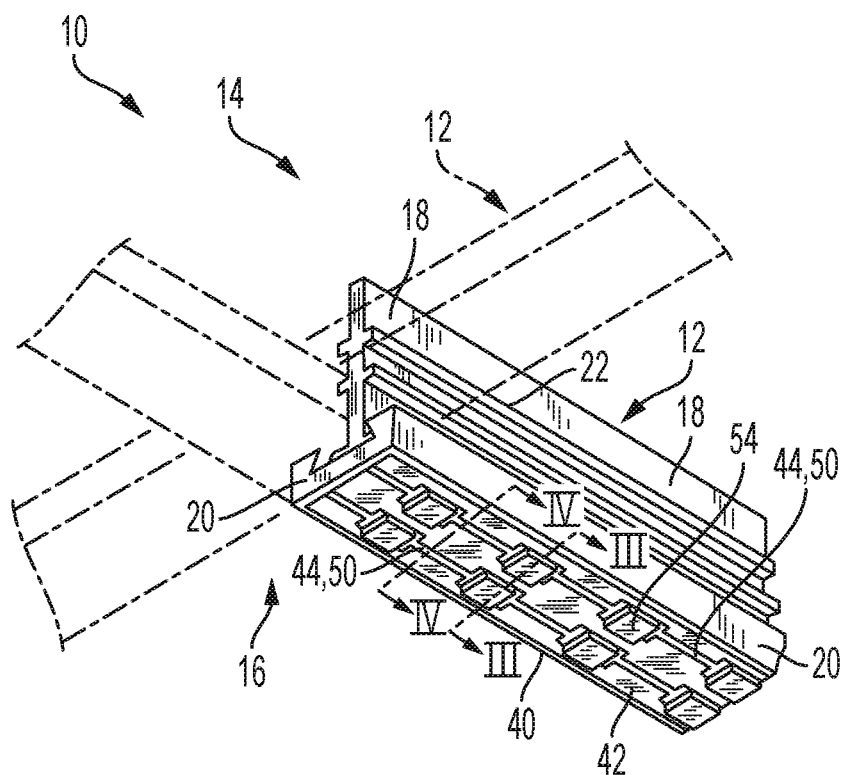
FIG. 1 is a schematic perspective view showing a ceiling grid system including a ceiling module in accordance with the present disclosure.

Referring to FIG. 1, in an exemplary application of the present disclosure, a ceiling grid system 10 is shown, which includes a plurality of individual ceiling modules 12 made in accordance with the present disclosure. Ceiling grid system 10 may be used in a building interior, for example, to separate an upper, utility space 14 above ceiling grid system 10 from a lower, occupied working space 16 which is more closely controlled by the HVAC system of the building.

Ceiling module 12 may be formed of an extruded or sheet stock metallic component having a substantially uniform cross section and high heat conductivity, such as aluminum or an aluminum alloy, such as 3000, 4000, 5000 and 6000 series aluminum alloys, which typically have a thermal conductivity over 150 W/m-K. Other, less heat conductive, metals and metal alloys include low carbon steel and stainless steel. Advantageously, aluminum or aluminum alloys combine the desired features of high heat conductivity with high strength, while also being sufficiently lightweight for use in a ceiling grid system or similar application requiring lightweight structural components. In one embodiment, ceiling module 12 may have a length of as little as 6 inches, 12 inches, 18 inches, or as great as 24 inches, 36 inches, 48 inches or greater, or within any range defined between any two of the foregoing values, such as may be needed for complying with any applicable standard constructions.

Figure 2A:
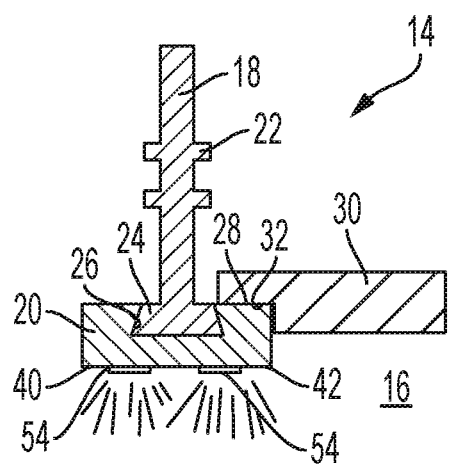
FIG. 2A is an end view of a ceiling module, further showing a portion of a ceiling tile supported by the ceiling module.

Referring additionally to FIG. 2A, ceiling module 12 may advantageously be formed as a two-part structure including an elongate structural support 18 and an elongate light module 20 which is separate from, and removably connectable to, structural support 18. Structural support 18 and light module 20 may each be formed of the same or different heat conductive metals or metal alloys such as those identified above, and both generally function to provide structural support for the lighting assembly described below. In another embodiment, structural support 18 and light module 20 may be monolithically or integrally formed of the same extrusion though, for the reasons discussed below, it may be preferable for the foregoing components to be formed separately from one another for manufacturing purposes.

Structural support 18 and light module 20 form the structural component of a ceiling grid, and may be attached to other like components in a suitable manner using mechanical fasteners (not shown) or the connector modules described below, for example, to form a structural grid arrangement which is suspended from a permanent, structural ceiling in a building environment, i.e., is the structural grid component of ceiling grid system 10 of FIG. 1, in which additional like structural supports are shown schematically in dashed lines. Structural support 18 and/or light module 20 may also include one or more heat dissipation projections or fins 22 monolithically or integrally formed therewith, which extend from the main body of structural support 18 to increase the available surface area of structural support 18 available for heat dissipation into utility space 14 via convection.

Referring to FIG. 2A, structural support 18 may include a first connector structure, and light module 20 may include a cooperating second connector structure connectable to the first connector structure. In one embodiment, the first connector structure is formed as a projection 24 and the second connector structure is formed as a channel 26. For example, projection 24 may extend from structural support 18, and may be shaped as a dovetail-type projection slidably receivable within a dovetail-type channel formed in light module 20. Alternatively, the foregoing arrangement may be reversed, in which structural support 18 includes channel 26 and light module 20 includes projection 24. In this manner, light module 20 may be attached to structural support 18 by a longitudinal sliding engagement between the foregoing components prior to ceiling module 12 being installed as part of the ceiling grid system 10. In one embodiment, the foregoing connection may be configured as a close mechanical fit by which light module 20 is frictionally engaged with structural support 18 to facilitate the efficient conduction of heat between the foregoing components by direct contact. If desired, suitable thermal interface materials, such as heat conductive pastes or greases, may be applied between the foregoing components to promote an even more efficient conduction of heat.

Still referring to FIG. 2A, light module 20 may include an upper surface forming a shelf 28 for supporting one or more ceiling tiles 30 in the ceiling grid system 10 wherein, for example, each ceiling tile 30 may include a notched edge 32 for receipt on shelf 28 of light module 20. If ceiling tile 30 is made of a heat insulating material, heat from light module 20 may be transferred effectively directly from light module 20 to structural support 18 via conductive contact as opposed to tile 30, for subsequent dissipation from structural support 18 via convection within utility space 14 above ceiling tiles 30 of ceiling grid system 10.

Figure 2B:
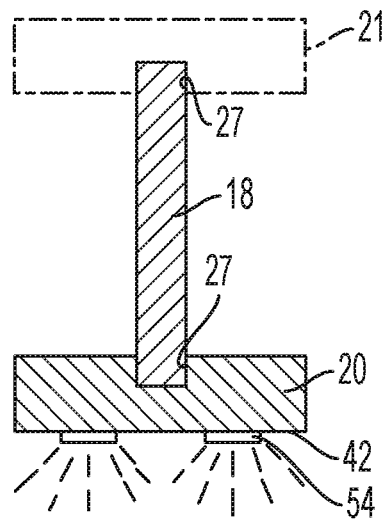
FIG. 2B is an end view of a ceiling module according to another embodiment.

Referring to FIG. 2B, alternative cross-sectional shapes of structural support 18 and light module 20 are shown according to another embodiment. Structural support 18 and light module 20 may each be cut lengths of metallic sheet stock material having rectangular cross sections, with a channel 27 machined along a broad side of the length of light module 20. An end side of structural support 18 may be fitted, such as via an interference fit, within channel 27. Optionally, a further structural member 21, analogous to light module 20 in shape but lacking the lighting elements described below, may be fitted to the upper end of structural support 18 to form an I-beam type construction for ceiling module 12 to provide increased structural support and/or increased mass for conductive receipt of heat from the lighting elements.

According to the present disclosure, and referring to FIGS. 1-4, light module 20 includes an exposed deposition surface 40 upon which a lighting configuration is directly deposited via a thick film application method, as described in detail below. For example, if light module 20 is made of aluminum or aluminum alloy, deposition surface is the exposed aluminum or aluminum alloy surface of light module 20.

Figure 5A:
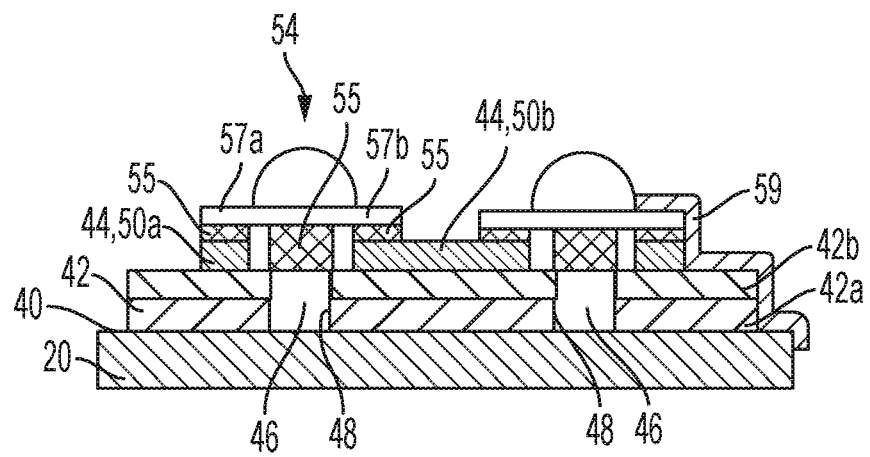
FIG. 5A is a sectional view similar to FIG. 3, showing a first light module configuration.
Figure 5B:
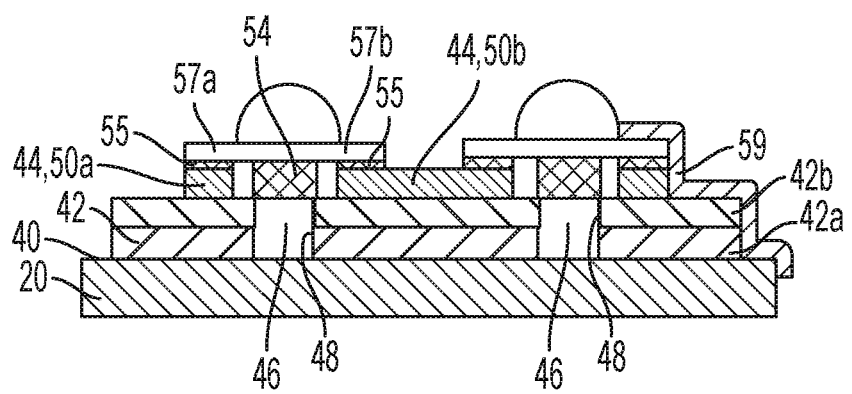
FIG. 5B is a sectional view similar to FIG. 3, showing a second light module configuration.

FIGS. 5A and 5B illustrate exemplary layered structures in accordance with the present invention, as described in detail below, though these figures are schematic and are not drawn to scale in connection with the thicknesses of the layers of the structures.

A first exemplary light module configuration and thick film application process is described below with primary reference to FIG. 5A, by which layers and components of a lighting configuration may be applied directly to deposition surface 40 of light module 20. In a first step, one or more dielectric or electrically insulating layers 42 are deposited directly onto deposition surface 40 of light module 20 via a thick film coating technique such as screen printing. The composition of insulating layer 42 may be provided in the form of a viscous liquid or paste which generally includes one or more of at least one polymer resin, inorganic particles, a glass phase, and at least one organic carrier liquid or solvent.

Generally, the insulating layer 42 functions to electrically insulate the material of light module 20 from a circuit layer 44 which is subsequently deposited on insulating layer 42, though in some embodiments, insulating layer 42 may also be heat conductive and sufficiently thin to facilitate heat conduction from the LED units through insulating layer 42 into the material of light module 20 as may be necessary. In other embodiments, as described below, openings are formed in insulating layer 42 which may be filled with a deposited metallic layer to form thermal vias through insulating layer 42 for direct conductive transfer of heat from the LED units to light module 20.

In the pre-cured composition of insulating layer 42, the polymeric resin provides a binder or carrier matrix for the inorganic particles, and also provides adhesion of the composition to the underlying substrate prior to the heat cure step in which the polymeric resin is removed. The inorganic particles form the bulk material of insulating layer 42 and also function to conduct heat through insulating layer 42. The organic carrier liquid provides a removable carrier medium to facilitate application of insulating layer 42 prior to heat cure, and is removed upon heat cure. The pre-cured composition of insulating layer 42 may also include other additives, such as surfactants, stabilizer, dispersants, as well as one or more thixotropic agents such as hydrogenated castor oil, for example, to increase the viscosity as necessary in order to form a paste.

The polymer resin may be an epoxy resin, ethyl cellulose, ethyl hydroxyethyl cellulose, wood rosin, phenolic resins, polymethacrylates of lower alcohols, or mixtures of the foregoing.

The inorganic particles may be oxides such as aluminum oxide, calcium oxide, nickel oxide, silicon dioxide, or zinc oxide, for example, and/or other inorganic particles such as aluminum nitride, beryllium oxide, and may have a particle size of as little as 1 micron, 3 microns, 5 microns, or as great as 7 microns, 9 microns, or 12 microns, or may have a size within any range defined between any two of the foregoing values. Advantageously, the use of aluminum-containing dielectric inorganic materials in insulating layer 42 may provide a favorable coefficient of thermal expansion (CTE) match with the underlying aluminum or aluminum alloy substrate of light module 20 for enhanced thermal cycling durability and consequent physical longevity.

The inorganic portion of the composition may also include a glass phase, such as a borosilicate glass frit, which provides a matrix for the inorganic particles, facilitates sintering during the heat cure step at temperatures below the melting point of the substrate, and also provides adhesion of the composition to the underlying substrate following the heat cure step.

Suitable solvents may include relatively high boiling solvents having a boiling point of 125° C. or greater, which evolve at a slower rate than relatively lower boiling point solvents in order to provide a sufficiently long dwell time of the composition on the screen during the printing process. Examples of relatively high boiling point solvents include ethylene glycol, propylene glycol, di(ethylene)glycol, tri(ethylene)glycol, tetra(ethylene)glycol, penta(ethylene)glycol, di(propylene)glycol, hexa(ethylene)glycol, di(propylene)glycol methyl ether, as well as alkyl ethers of any of the foregoing and mixtures of the foregoing.

In the composition of insulation layer 42 prior to curing, the inorganic content is typically as low as 45 wt. %, 50 wt. %, or 55 wt. % or as great as 70 wt. %, 75 wt. %, or 80 wt. % of the total composition, or may be present within any range defined between any two of the foregoing values, and the organic content is typically as low as 20 wt. %, 25 wt. %, or 30 wt. %, or as great as 45 wt. %, 50 wt. % or 55 wt. % of the total composition, or may be present within any range defined between any two of the foregoing values. Of the inorganic content of the composition, the glass phase is typically present in an amount as low as 15 wt. %, 20 wt. %, or 25 wt. % or as great as 45 wt. %, 50 wt. %, or 55 wt. % of the total inorganic content, or may be present within any range defined between any two of the foregoing values, with the inorganic particles comprising the balance of the inorganic content of the composition. The solvent typically comprises as low as 65 wt. %, 70 wt. %, or 75 wt. % or as great as 85 wt. %, 90 wt. %, or 95 wt. % of the total organic content of the composition, or may be present within any range defined between any two of the foregoing values.

The composition of insulation layer 42 may be applied via a screen printing process directly through a screen or stencil (not shown) directly onto deposition surface 40, optionally followed by an initial drying step, either at ambient or elevated temperature, in which some of the volatile components of the composition are evaporated. In a subsequent step after initial application followed by optional drying, insulating layer 42 may be heat cured in a furnace, such as a belt furnace, by heating insulating layer 42 to a desired elevated curing temperature to drive off any remaining volatile components, leaving the final layer in cured, solid form.

The curing temperature may be as low as 500° C., 550° C., or 600° C., of as high as 700° C., 750° C., or 800° C. or more, or within any range defined between any two of the foregoing values, and may be held at a dwell time of 2-45 min, for example. In one exemplary embodiment, the curing temperature may be from 550-600° C. at a dwell time of 2-30 min. The curing temperature should be below the melting point of the substrate.

After curing, the deposited and cured insulation layer 42 may consist essentially of inorganic components, such as the inorganic particles and/or glass phase, which inorganic components may comprise greater than 90%, greater than 95%, or greater than 99% by weight of the layer. Alternatively stated, organic components, if present, may comprise less than 10%, less than 5%, or less than 1% by weight of the deposited and cured insulation layer 42 and/or the deposited and cured insulation layer 42 may have a total carbon content of less than 5% or 1% by weight.

One advantage of the two-piece construction of ceiling module 12 is that each light module 20 has a mass that is only a portion of the overall larger mass of a respective ceiling module 12 of which the light module 20 is a part. Thus, during the steps described herein by which insulating layer 42 and circuit layer 44 are applied to light module 20 and are then cured by heating, the overall mass of light module 20 is relatively small, such that light module 20 itself does not act as a sufficiently massive heat sink such that an excessive amount of heat is needed to elevate the applied temperature to properly cure the thick film layers that are applied to light module 20. However, once such thick film layers are applied and cured, light module 20, particularly when attached to structural support 18, may function as a portion of a larger heat sink with greater mass for purposes of more efficiently conducting heat away from the LED units attached to light module 20.

As desired, the foregoing process steps may be repeated to sequentially build insulating layer 42 to a desired final applied thickness. In one embodiment, insulating layer 42, after completion of a desired number of the foregoing application, drying, and heat curing steps, may be applied to a total film thickness of as little as 5 microns, 10 microns, 25 microns, or 50 microns, or as great as 100 microns, 250 microns, or 500 microns, or within any range defined between any two of the foregoing values. Also, multiple insulating layers 42 may be sequentially applied onto each other according to the above process to eliminate the probability of defects in the insulating layer 42, such as pinhole defects and/or the presence of debris. For example, in FIG. 5A, two discrete insulating layers 42a and 42b are shown, though more or less layers may be used as desired.

Referring to FIG. 5A, either before or after insulating layer 42 is applied, thermal vias 46 may be applied in the same manner, and using the same materials, as described below in connection with conductive circuit layer 44. In one embodiment, the application of thermal vias 46 onto deposition surface 40 of light module 20 via the thick film-based print and cure techniques described herein may be the initial step in forming the overall construction shown in FIG. 5A. In this embodiment, thermal vias 46 may be applied to deposition surface 40 of light module 20 at areas corresponding to gap spaces or openings 48 in the subsequently applied insulating layer 42, with thermal vias 46 direct contact with deposition surface 40 of light module 20. In another embodiment, thermal vias 46 may be applied within gap spaces or openings 48 of insulating layer 42 subsequently to the application of insulating layer 42 to deposition surface 40 of light module 20. The function of thermal vias 46 is described further below.

An electrically conductive circuit layer 44 may be deposited directly onto the insulation layer 42 via similar thick film techniques. The circuit layer 44 may be provided in the form of a viscous liquid or paste which generally includes conductive metal particles, at least one polymeric resin, and at least one organic carrier liquid or solvent. The composition of circuit layer 44 may also include a glass phase or metal oxide particles to promote adhesion of circuit layer 44 to the underlying insulating layer 42.

Generally, the circuit layer 44 functions to provide an electrically conductive circuit to provide power to the LED units, and is also itself heat conductive and sufficiently thin to facilitate heat conduction from the LED units to insulating layer 42 and thence into the material of light module 20. In the pre-cured composition of circuit layer, the conductive metal particles form the bulk of the final layer, and conduct electric current to the LED units. The polymeric resin provides a binder or carrier matrix for the conductive metal particles, and also provides adhesion of the composition to the underlying insulating layer 42 prior to the heat cure step in which the polymeric resin is removed. The organic carrier liquid provides a removable carrier medium to facilitate application of circuit layer 44 prior to heat cure, and is removed upon heat cure. The pre-cured composition of circuit layer 44 may also include other additives, such as surfactants, stabilizer, dispersants, as well as one or more thixotropic agents such as hydrogenated castor oil, for example, to increase the viscosity as necessary in order to form a paste.

The polymer resin may be an epoxy resin, ethyl cellulose, ethyl hydroxyethyl cellulose, wood rosin, phenolic resins, polymethacrylates of lower alcohols, or mixtures of the foregoing.

Suitable conductive metal particles include Ag, Cu, Zn, and Sn, or a mixture of the foregoing, wherein Ag is particularly suitable. The metal particles may also be alloys of the foregoing elements, such as Ag/Pt and Ag/Pd. The metal particles may be pure elemental metal, or may be in the form of metal derivatives such as oxides or salts, e.g., silver oxide ($Ag_2O$) or silver chloride (AgCl). Also, organometallic compounds may be used, such as metal methoxides, ethoxides, 2-ethylhexoxides, isobutoxides, isopropoxides, n-butoxides, and n-propoxides, for example. These metal particles may have a particle size of as little as 1 micron, 3 microns, 5 microns, or as great as 7 microns, 9 microns, or 12 microns, or may be within any size range defined between any two of the foregoing values.

Suitable organic carrier liquids or solvents include those listed above in connection with the composition of insulation layer 42, or mixtures of the foregoing.

In the composition of circuit layer 42, the metallic particles are typically present in an amount from as little as 45 wt. %, 50 wt. % or 55 wt. % to as great as 70 wt. %, 75 wt. % or 80 wt. % of the total composition, or may be present in an amount within any range defined between any two of the foregoing values. The glass phase or other metal oxide particles may be absent from the composition or, if included, may be present in an amount of as little as 1 wt. %, 3 wt. % or 5 wt. % or as great as 7 wt. %, 9 wt. % or 10 wt. % of the total composition, or may be present in an amount within any range defined between any two of the foregoing values. Typically, the solvent will comprise the primary component of the balance of the composition.

Similar to insulating layer 42, the circuit layer composition may be applied via a screen printing process directly through a screen or stencil directly onto insulation layer 42, optionally followed by an initial drying step, either at ambient or elevated temperature, in which some of the volatile components of the composition are evaporated. In a subsequent step after initial application followed by optional drying, circuit layer 44 may be heat cured in a furnace, such as a belt furnace, by heating circuit layer 44 to a desired elevated curing temperature to drive off any remaining volatile components, leaving the final layer in cured, solid form.

The curing temperature may be as low as 500° C., 550° C., or 600° C., or as high as 700° C., 750° C., or 800° C., or within any range defined between any two of the foregoing values, and may be held at a dwell time of 2-45 min. In exemplary embodiments, for a silver-based circuit layer, the curing temperature may be from 550-570° C. at a dwell time of 2-10 min., and for a copper-based circuit layer, the curing temperature may be from 550-600° C. at a dwell time of 5-7 min. The curing temperature should be below the melting point of the substrate.

Total thickness for circuit layer 44 following successive film builds by the foregoing additive deposition thick film techniques may be as thin as 3 microns, 5 microns, or 10 microns, or as thick as 20 microns, 50 microns, or 100 microns, or may have a thickness within any range defined between any two of the foregoing values.

After curing, the deposited and cured circuit layer 44 may consist essentially of metallic components, which may comprise greater than 90%, greater than 95%, or greater than 99% by weight of the layer. Alternatively stated, organic components, if present, may comprise less than 10%, less than 5%, or less than 1% by weight of the deposited and cured circuit layer 44 and/or the deposited and cured circuit layer 44 may have a total carbon content of less than 5% or 1% by weight.

Referring to FIG. 5A, further details of the present construction are shown, in which thermal vias 46 are present in openings 48 in insulating layer 42, and circuit layer 44 is deposited over insulating layer 42. Individual LED units 54 may be mechanically and electrically connected as shown in FIG. 5A, in which one portion of each LED unit is attached to thermal via 46 via a solder layer 55 using a metallic solder re-flow or solder bump process with or without additional wire bonding via copper foils, for example. In this manner, thermal vias 46 function to conduct heat (but not electricity) directly from the LED units 54 to the substrate material of light module 20 without heat conductive interference from insulating layer 42. Also, positive and negative electrical connections 57a and 57b of each LED unit 54 may be connected to separate traces 50a and 50b of circuit layer 44 via additional solder layers 55.

Optionally, an overcoat layer 59 (FIGS. 5A and 5B) may be provided directly over circuit layer 44 and/or surrounding layers in order to protect circuit layer 44 and/or surrounding layers from oxidative degradation or other environmental and/or contact damage. The overcoat layer 59 may be an opaque or translucent layer based on heat-cured silicone or epoxy materials, for example, or may be a glass layer for high temperature operation, heat conductivity, and reflectivity. Overcoat layer 59 is shown only in the right portion of FIGS. 5A and 5B for clarity, though it should be understood that overcoat layer 59 could cover substantially the entire front side of the substrate 20 except for the exposed LED units 54.

Figure 3:
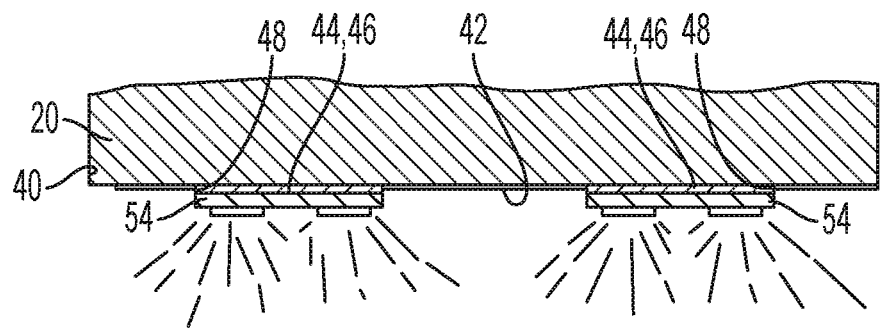
FIG. 3 is a sectional view taken along line 3-3 of FIG. 1.
Figure 4:
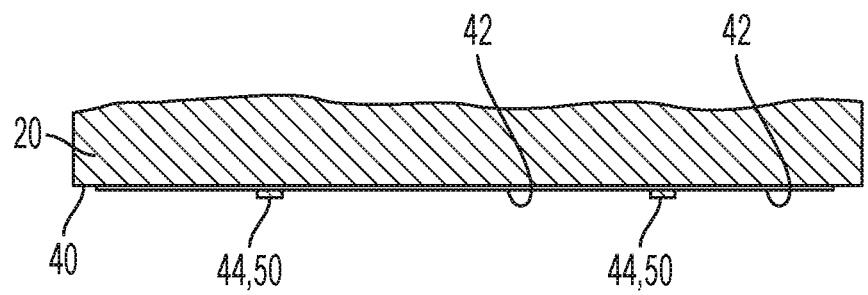
FIG. 4 is a sectional view taken along line 4-4 of FIG. 1.

Advantageously, as best shown in FIGS. 3 and 5A, according the present disclosure, a lighting configuration is provided in an integral manner directly on the exposed metallic deposition surface 40 of light module 20, wherein insulating layer 42 and circuit layer 44 together have a total printed film thickness of as little as 25 microns, 40 microns, or 50 microns, or as great as 100 microns, 150 microns, or 200 microns, or may have a thickness within any range defined between any two of the foregoing values. The LED units 54 themselves provide only a very small incremental additional thickness to the foregoing layered structure, such that the overall thickness of the lighting configuration is minimized. In this manner, the lighting configuration is provided in a pre-assembled manner directly onto light module 20 prior to the point of field installation at which light module 20 is attached to structural support 18 when the ceiling grid system 10 is assembled, thereby easing installation and obviating the need for separate, self-contained LED modules which are mechanically attached to existing ceiling grid components.

Further, as may also be seen from FIGS. 3 and 5A, heat from LED units 54 is conveyed directly from the backside of the dies of the LED units 54 by conduction directly through thermal vias 46, light module 20 and, referring additionally to FIGS. 1 and 2A, into structural support 18 for dissipation within upper space 14 above ceiling grid system 10 to facilitate the efficient removal of heat from the LED units 54 and enhance the more efficient operation of the LED units 54. Thus, the present construction facilitates the use of both low intensity and high intensity LED units with light module 20, depending on the lighting needs of the space being illuminated.

Referring to FIG. 5B a second exemplary light module configuration and thick film application process is shown which, except as described below, has the same configuration and function as that shown in FIG. 5A.

In the embodiment of FIG. 5B, insulating layer 42 is formed as one or several sequentially applied polymer-based dielectrics which include a base polymer such as epoxy, silicone, polyimide, polyester, phenolic, and vinyl, typically provided in a viscous liquid or paste form and including one or more solvents and optionally other additives such as surfactants, stabilizers, dispersants and/or thixotropic agents. The polymer-based dielectric may be applied to deposition surface 40 of light module 20 via known thick film application techniques such as screen printing, for example, followed by curing at a relatively low temperature, which may be as little as 100° C., 125° C. or 150° C., or as high as 250° C., 300° C., or 325° C., or within any range defined between any two of the foregoing temperatures, such as 100° C. to 325° C., 125° C. to 300° C., or 150° C. to 250° C. Typical cure times may range from as little as one half hour to one hour or longer, such as 1.5 hours. Optionally, the curing may be conducted via a two-step cure, such as by using an initial drying or "snap" cure step at a temperature toward a lower end of the foregoing ranges or below, such as room temperature, followed by a full curing step at a temperature toward the upper end of the foregoing ranges. The polymer-based dielectric layer or layers according to this embodiment may be applied to a total thickness of as little as 15 microns, 20 microns, or 20 microns, or as great as 30 microns, 40 microns, or 75 microns, or may have a thickness within any range defined between any two of the foregoing values. Typically, at least two layers will be required for most applications.

Following application of insulating layer 42, circuit layer 44 may be applied to insulating layer 42. In the embodiment of FIG. 5B, circuit layer 44 may be an electrically conductive polymer/metal material including polymeric and metallic components. Exemplary polymers include polyamide and phenolic polymers, for example, as well as epoxy, silicone, polyester, and vinyl, and exemplary conductive metals include silver and copper, for example. The polymer and metallic components are typically provided in a viscous liquid or paste form, including one or more solvents and optionally other additives such as surfactants, stabilizers, dispersants and/or thixotropic agents.

The polymer/metal conductive material may also be applied to deposition surface 40 of light module 20 via known thick film application techniques such as screen printing, for example, followed by curing at a relatively low temperature, which may be as little as 100° C., 125° C. or 150° C., or as high as 250° C., 300° C., or 325° C., or within any range defined between any two of the foregoing temperatures, such as 100° C. to 325° C., 125° C. to 300° C., or 150° C. to 250° C. Typical cure times may range from as little as one half hour to one hour or longer, such as 1.5 hours. The polymer/metal conductive material according to this embodiment may be applied to a total thickness of as little as 5 microns, 10 microns, or 15 microns, or as great as 20 microns, 25 microns, or 30 microns, or may have a thickness within any range defined between any two of the foregoing values.

Advantageously, the polymer/metal conductive material is solderable, meaning that solders may be applied directly to the material for electrical connections. Suitable solders include lead-free solders, such as tin-based solders and bismuth-based solders, for example. Following application of circuit layer 44, LED units 54 are attached as described above in connection with FIG. 5A. In a further embodiment, circuit layer 44 may be in the form of a silver conductive epoxy, which fills thermal vias 46 and also serves as an electrically conductive layer to which LED units 54 may be directly adhered without the need for a solder-based connection. In this embodiment, effective heat dissipation may be achieved by the silver conductive epoxy material through thermal vias 46, the material may be applied by low temperature processing, and the material provides the ability to print on flexible film substrates or alternatively, to print on rigid substrates such as aluminum followed by forming the substrate into a curved shape after the circuit layer 44 is deposited and cured.

One particular advantage of the configuration shown in FIG. 5B is that each of insulating layer 42 and circuit layer 44 may be applied using conventional thick film techniques such as screen printing, and may also be cured at relatively low temperatures. In particular, in the configuration shown in FIG. 5B, once thermal vias 46 are printed and cured at a relatively high temperature, such as greater than 500° C., all of the remaining steps, including application of insulating layer 42 and circuit layer 44, as well as the soldering of LED units 54 to circuit layer 44, may be conducted at relatively low temperatures, such as below 300° C., in order to conserve energy and cost.

Although the present concept has been described above in connection with ceiling module 12, which is formed as a two-part structure including an elongate structural support 18 and an elongate light module 20, other lighting configurations are possible. For example, in an alternative embodiment, a modular strip construction may be formed, similar to light module 20, including a heat conductive substrate such as aluminum. The modular strip may be formed as a solid or hollow extrusion, or as an elongate strip having a thin profile. The thick film printed layers and LED units described above may be printed directly onto the modular strip in the same manner as described above.

The modular strip may be mounted to new or existing structural components of a building construction, such as beams, trusses, or joists, for example. In this manner, the modular strip may be selectively mounted to any desired location within a building interior, for example, as well as to other locations such as building exteriors or any other support in an environment where lighting is desired. Suitable interior applications include horticultural facilities such as greenhouses, athletic facilities such as indoor stadiums and arenas, performing arts facilities such as theaters, or any other internal spaces. Still further, such modular strips may be mounted exteriorly to building facades to provide exterior perimeter lighting, or to elevated poles to provide street lighting, for example.

Figure 6:
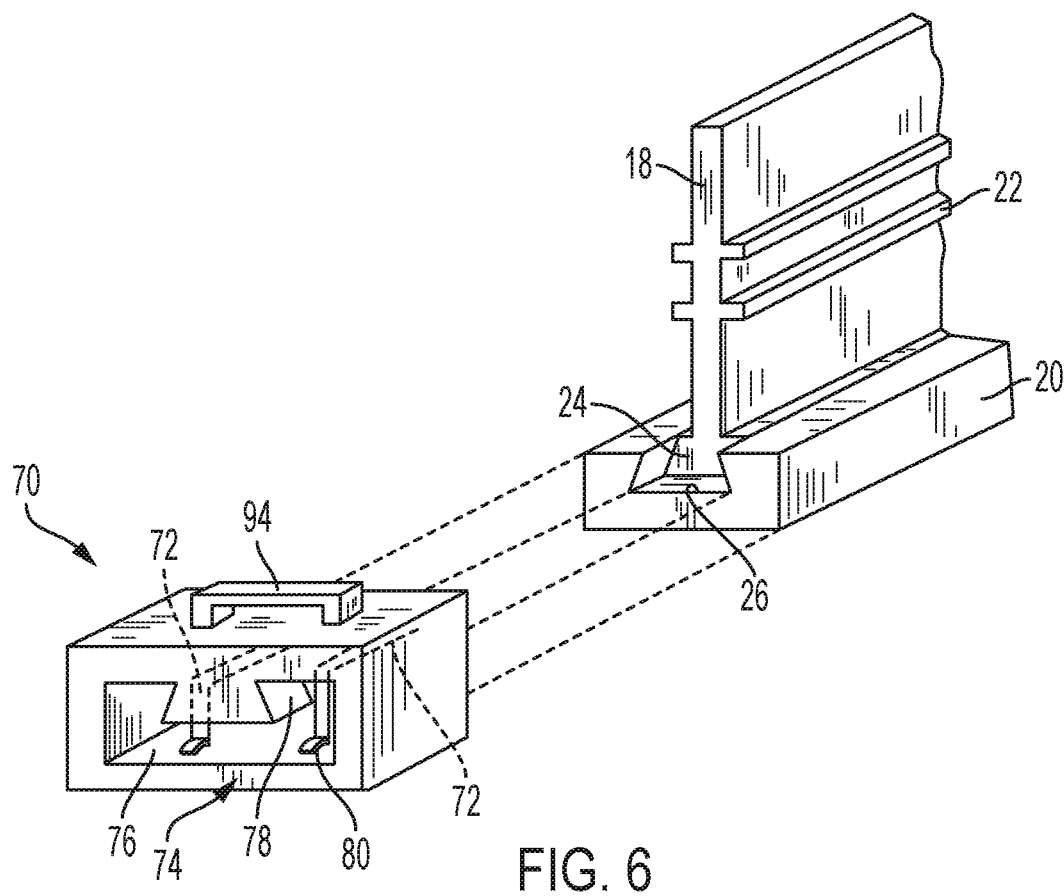
FIG. 6 is partial perspective view of a ceiling module together with a connector module.
Figure 7:
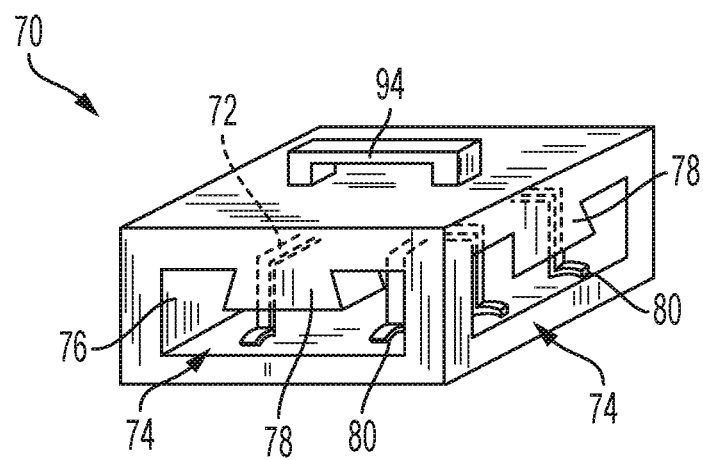
FIG. 7 is a perspective view of another connector module.
Figure 8:
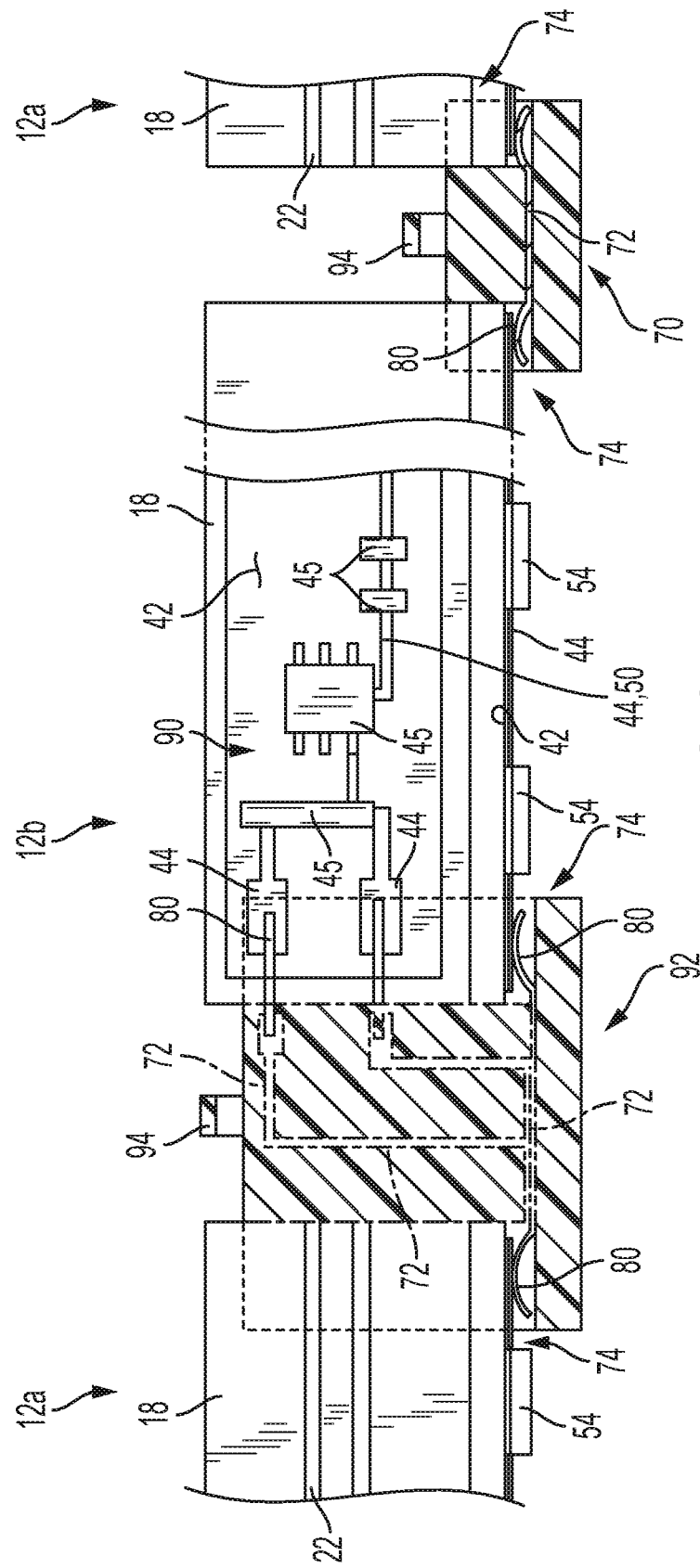
FIG. 8 is a partial perspective view of a ceiling module and a power in-feed connector module, further showing power input circuitry.

Referring to FIGS. 6 and 7, an exemplary modular connector 70 for connecting two or more ceiling modules 12 is shown. Modular connector 70 may generally be formed of an injection-molded plastic body having an electrically conductive circuit frame 72 embedded therein made of copper or brass, for example, to provide electrical connectivity between two or more connected ceiling modules 12. Circuit frame 72 and its electrical leads are schematically shown in FIGS. 6-8 partially in dashed lines with the understanding that one of ordinary skill in the art would selectively configure the particular design of circuit frame 72 to ensure the proper electrical connections and isolations between the various circuits that may be needed. Connector module 70 includes two or more ports 74 which are shaped to interface with the ends of light modules 20, with ports 74 including, for example, a cavity 76 having an internal projection 78 identical to that of structural support 18 for interfacing with channel 26 of light module 20 via an interference fit, for example. The circuit frames 72 within connector modules 70 may include sets of spring-loaded or other pressure-sensitive or friction responsive electrical contacts 80 for directly engaging circuit traces 50 of circuit layer 44 of light module 20 upon contact of a connector module 70 with a corresponding light module 20.

Connector modules 70 may be configured for in-line connections, in which ports 74 are provided on opposite sides of modules 70, or may include two, three or four ports 74, respectively, on respective sides of modules 70 as shown in FIG. 7 for effecting L-type, T-type, and X-type junctions between three of four ceiling modules 12, respectively. Connector modules 70 also themselves provide mechanical support between the ceiling modules 12.

Referring to FIG. 8, an exemplary power supply and electrical in-feed configuration is shown, in which a pair of standard ceiling modules 12a of the type described above are respectively connected to opposite ends of an electrical in-feed ceiling module 12b. Ceiling module 12b may be identical to ceiling module 12a, but additionally includes a power supply circuit 90, which may be a thick film printed layer set as described above, printed directly on the surface of structural support 18 of ceiling module 12 and including an insulating layer 42 and a circuit layer 44 including suitable circuitry, such as circuit traces 50 for connection of electrical components 45 directly to circuit layer 44 via a metallic solder re-flow or solder bump process with or without additional wire bonding via copper foils, for example.

In operation, the power supply circuit 90 receives power from the electrical supply within a building, such as 110 or 220 volts AC current, and steps down the current and/or converts the AC current into DC current as may be needed for powering the LED units 54 of one or more ceiling modules 12a and 12b. Typically, depending on the current supplied and the power requirements of the LED units 54 of ceiling modules 12, an electrical in-feed ceiling module 12b and its power supply circuit 90 may power the electrical in-feed ceiling module 12b itself, together with a series of several standard ceiling modules 12a.

Still referring to FIG. 8, an electrical in-feed connector module 92 may be used to provide power input to LED units 54 of a set of ceiling modules 12 from the power supply circuit 90. In-feed connector module 92 is similar to connector module 70, and may include one or more ports 74, circuit frames 72, and electrical contacts 80. In this manner, electrical power may be transferred from the building or other external supply through power supply circuit 90 and in feed connectors 92 to LED units 54 in a set of light modules 20.

In FIG. 8, on a side of the electrical in-feed ceiling module 12 opposite the electrical in-feed side in which electrical in-feed connector module 92 is shown, a standard connector module 70 is shown for forming a standard electrical and mechanical connection between the electrical in-feed ceiling module 12b and an adjacent standard ceiling module 12a in the manner described above and shown in FIGS. 5 and 6.

Further, in FIGS. 6-8, connector modules 70 and electrical in-feed modules 92 may each include an integrally formed or separately attached connector bar 94 or other suitable structure to accept a ceiling hanger or other hardware, for example, to facilitate mounting to ceiling structure components.

Referring to FIGS. 9-17, further embodiments of modular lighting assemblies are shown, which include light modules manufactured as described above and, except for the differences discussed below, the light modules are made of substantially the same materials and include electrical circuitry and LED units assembled in accordance with the thick film deposition techniques described in detail above.

Figure 9:
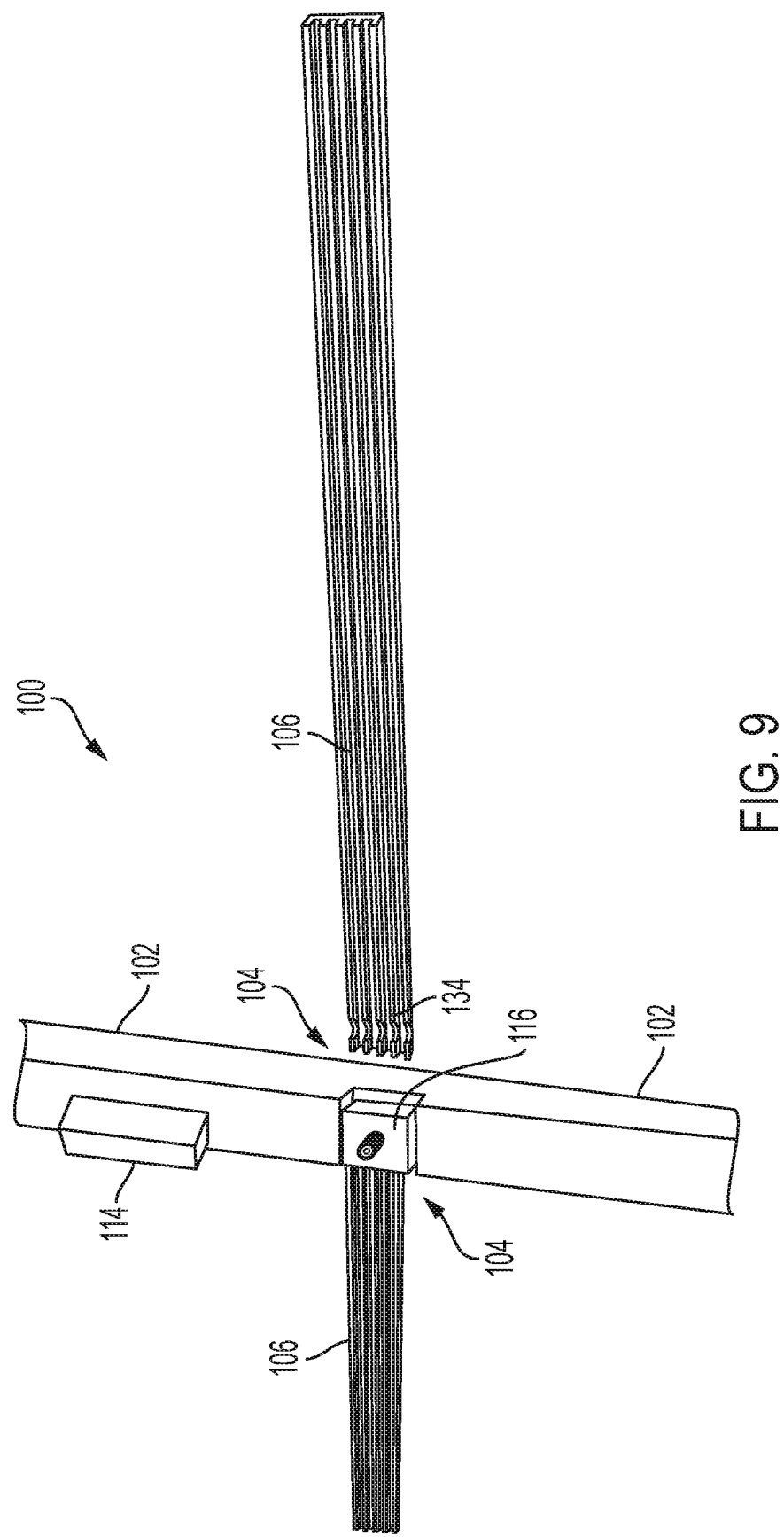
FIG. 9 is a perspective view of components of a modular lighting assembly according to a further embodiment.
Figure 10:
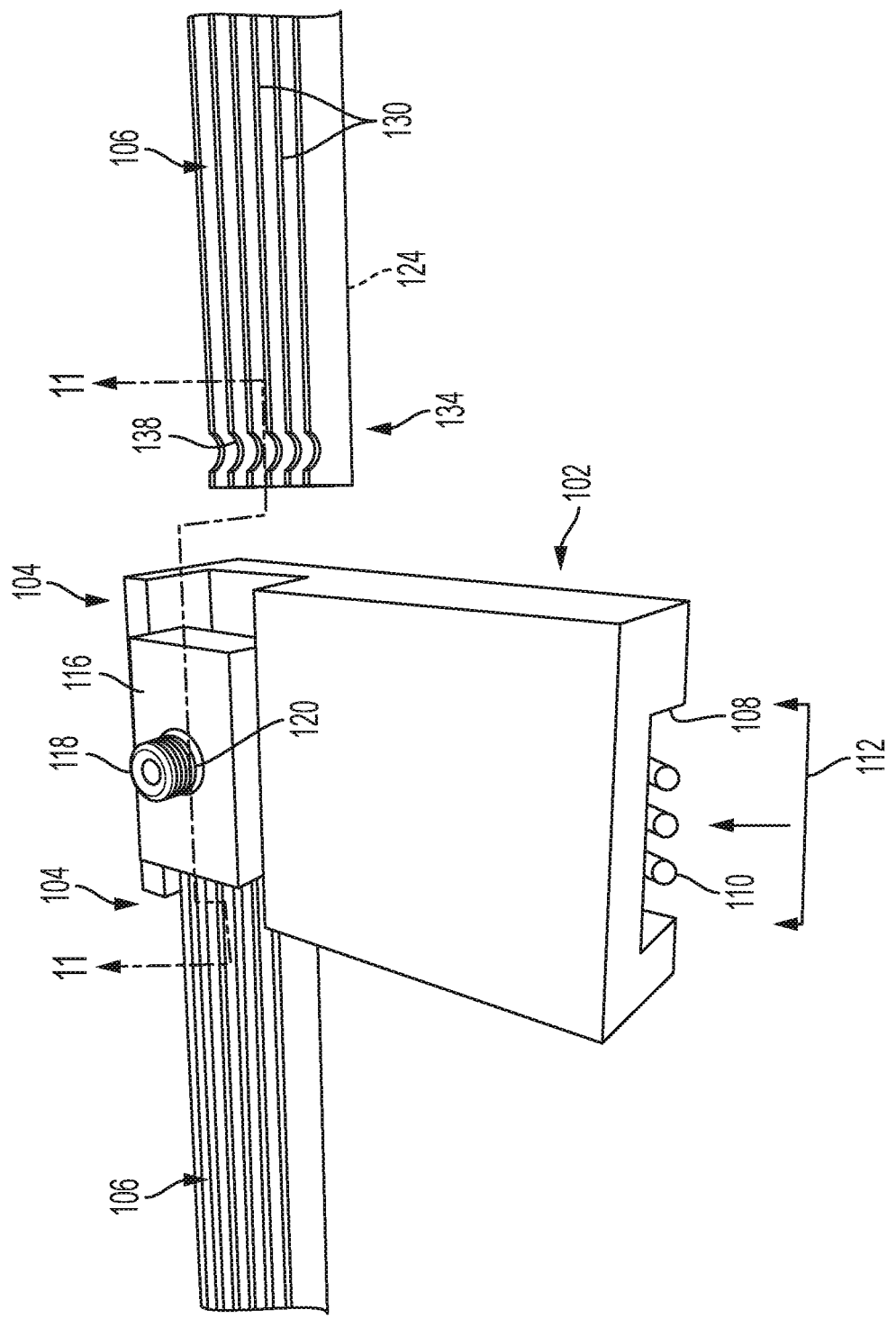
FIG. 10 is a close-up perspective view of the components of the lighting assembly of FIG. 9.

Referring to FIGS. 9 and 10, in one embodiment, a modular lighting assembly 100 generally includes one or more elongate spine units 102 each having a plurality of connecting interfaces 104, together with a plurality of light modules 106 releasably connectable to the connecting interfaces 104 of the spine units 102 in the manner described below. The spine units 102 may have any cross-sectional shape, and may also be shaped to be elongate and straight, or in the form of other shapes, such as L-shaped, T-shaped, or X-shaped, for example. The spine units 102 and light modules 106 may be conveniently shipped separate from one another in a disassembled condition, and then installed at a use location as described below.

The spine unit 102 may be formed from an insulating plastic material via extrusion or injection molding, for example, and is elongate in shape, extending along a longitudinal extent which, as shown in FIGS. 9 and 10 and described below, is substantially perpendicular to the orientation of the light modules 106 that are connected to spine unit 102. The spine unit 102 may be secured to a suitable support structure in an upper portion of an interior building space, or may be integrated into, or otherwise secured to, an existing ceiling grid structure within an interior building space.

Referring to FIG. 10, spine unit 102 includes a channel 108 extending along one of its sides for receipt of wires 110 via which power is supplied to light modules 106, and channel 108 may optionally be covered with a cover member 112 that may be releasably snap-fit into channel 108, for example. As shown in FIG. 9, spine unit 102 may also include one or more power supplies 114 mounted thereto for receiving power from a building power supply, such as 110 volts AC, and stepping down and/or converting the power to low voltage direct current (DC) to power the LEDs of light modules 106 via wires 110 and the electrical contacts described below. The number of power supplies 114 connected to spine unit 102 is generally proportional to the number of light modules 106 connected to spine unit 102 and the overall electrical load demands of the assembly.

Referring back to FIG. 10, spine unit 102 also includes a plurality of connecting interfaces 104 which, as described below, are in the form of quick-connect sockets which facilitate the connection of light modules 106 to spine unit 102 without the need for tools or separate fasteners. Referring to FIGS. 10-13, connecting interfaces 104 are formed as recesses in spine unit 102 which are disposed on opposite sides of a spring-biased connecting plate 116, which is connected to spine unit 102 by screw fastener 118 and spring 120. Spring 120 is disposed between the head of screw fastener 118 and plate 116 in a manner in which plate 116 is normally biased toward spine unit 102, though may be deflected away from spine unit 102 against the bias of spring 120 as described further below. Connecting interfaces 104 include a first set of electrical connectors 122 which are connected to, and receive power from, wires 110 and power supplies 114.

Light modules 106 may take the form of an extruded metal or metal alloy substrate, such as aluminum, having a lower surface 124 to which electrical circuitry 126 is applied via the thick film printing techniques described above, for example. Light modules 106 also include a plurality of LED units 128 mounted to the electrical circuitry 126 and spaced along the extent of the length of light modules 106. In this manner, each light module 106 serves several functions, including a substrate onto which electrical circuitry 126 may be printed, a structural support for mounting the LED units 128, and a heat sink for dissipating heat from the LED units into a surrounding environment via heat dissipation fins 130 (FIG. 10) extending from an upper surface 132 of light module 102.

Light modules 106 also include end portions 134 having a second set of electrical connectors 136 on the lower surface 124 of light modules 106 for mating with, and electrically connecting to, first electrical connectors 122 of spine unit 102. End portions 134 also include a connecting grove 138 formed within heat dissipation fins 130.

Figure 11:
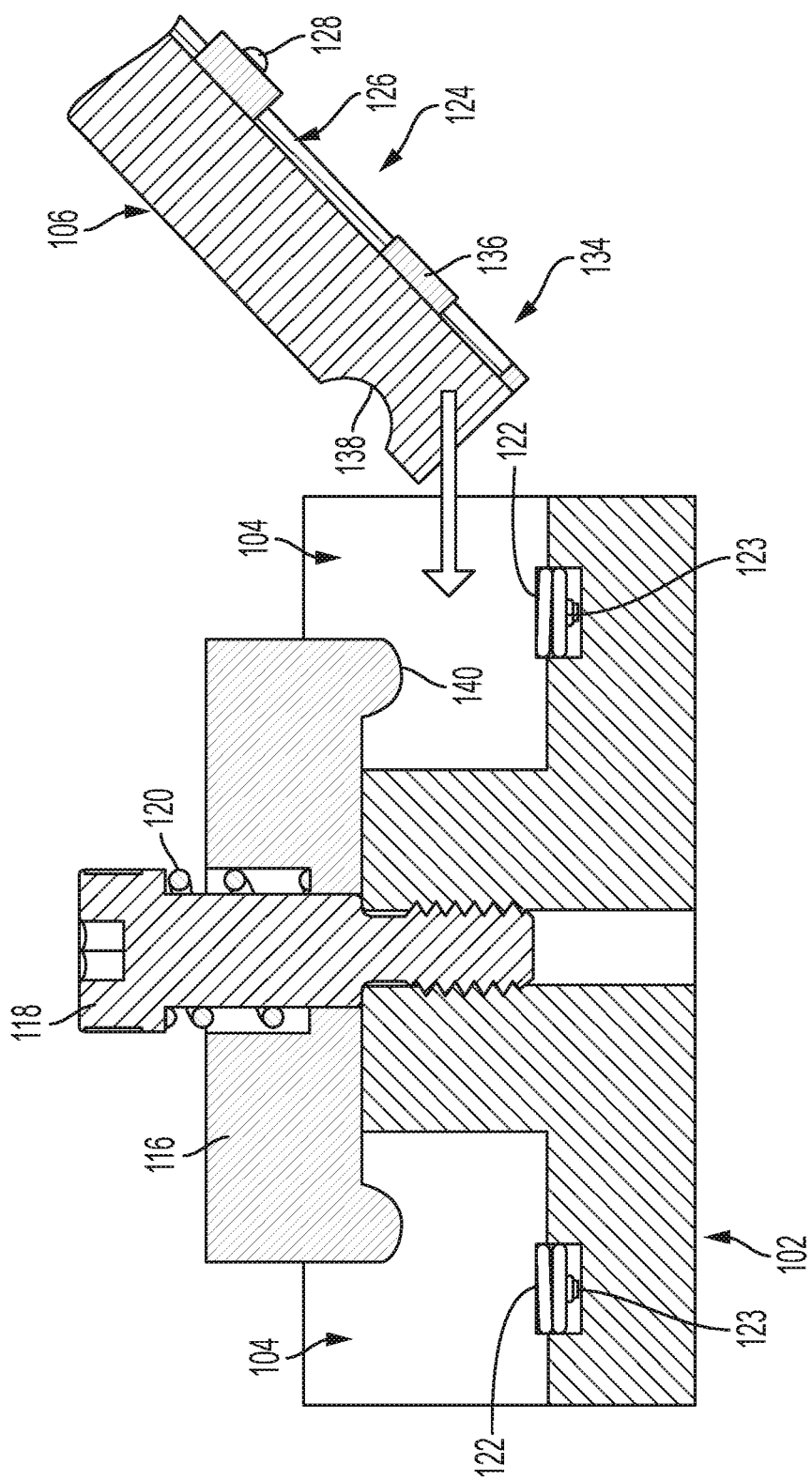
FIG. 11 is a sectional view taken along line A-A of FIG. 10, showing a light module in a first, pre-installation position.
Figure 12:
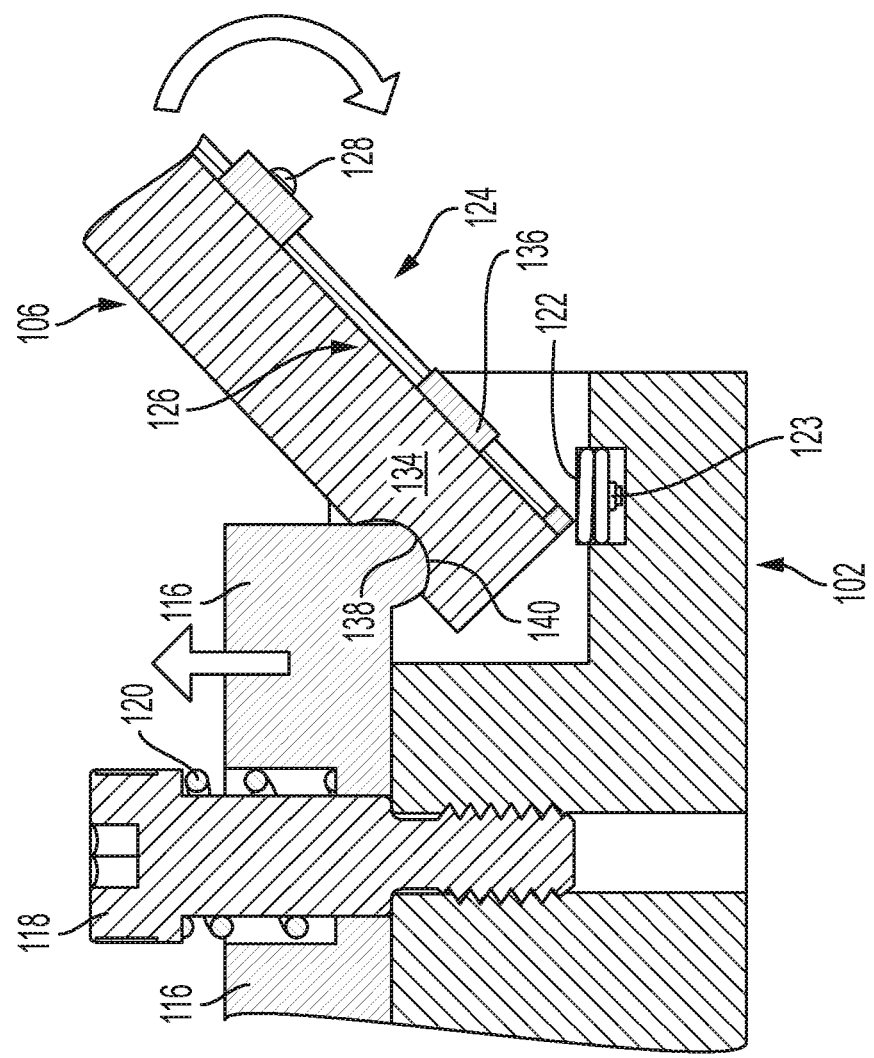
FIG. 12 is a sectional view taken along line A-A of FIG. 10, showing a light module in a second, partially installed position.
Figure 13:
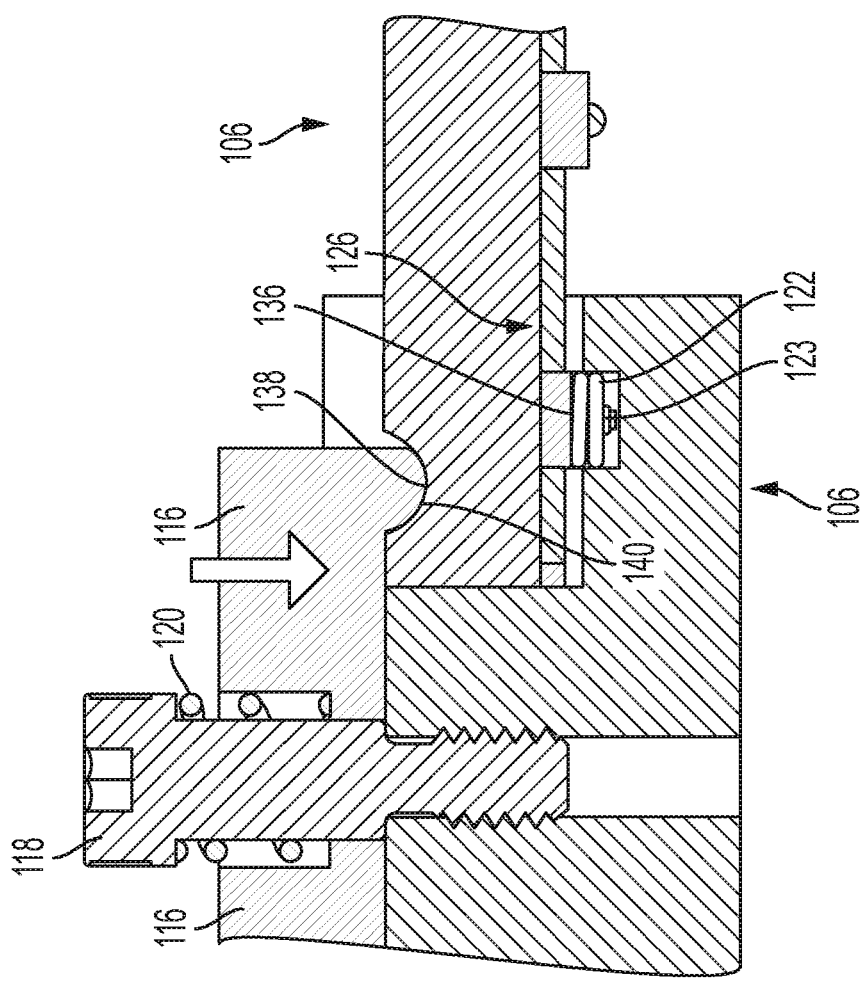
FIG. 13 is a sectional view taken along line A-A of FIG. 10, showing a light module in a third, fully installed position.

Referring to FIGS. 11-13, to connect a light module 106 to a corresponding connecting interface 104 of spine unit 102, the end portion 134 of a light module 106 is laterally inserted into the recess of connecting interface 104 along the direction of the lateral arrow in FIG. 11 at an angle, such as a 45 degree angle, for example, to initially engage connecting grove 138 with a corresponding alignment ridge 140 of plate 116. Thereafter, referring to FIG. 12, light module 106 is pivoted along the direction of the curved arrow in FIG. 12, in which plate 116 is temporarily biased upwardly and away from spine unit 102 along the direction of the upward arrow in FIG. 12 against the bias of spring 120.

Referring to FIG. 13, light module is then rotated to a position substantially parallel with spine unit 102 under an assisting return bias of spring 120 and plate 116 along the direction of the downward arrow in FIG. 13 to affirmatively capture and mechanically lock end portion 134 of light module 106 within connecting interface 104 while simultaneously engaging the second electrical connectors 136 of light module 106 with the first electrical connectors 122 of spine unit 102 such that electrical power may be provided to light module 106 from spine unit 102. Optionally, one or both of the first and second electrical connectors 122 and 136 may be spring biased to aid in establishing and maintaining abutting electrical contact between first and second electrical connectors 122 and 136. For example, in FIGS. 11-13 first electrical connectors 122 are shown as spring-biased connectors in which same are in an initial position in FIG. 11, wherein connectors 122 are biased by springs 123 to protrude slightly above the floor of the recess of interfaces 104, as well as in a partially biased position in FIG. 12 and a more fully biased, electrically connected position in FIG. 13. Exemplary spring-biased electrical connectors include spring clips from mobile devices which are available from Molex LLC.

In this manner, a number of light modules 106 may be quickly and conveniently installed to the connecting interfaces 104 along the sides of spine unit 102 without the need of tools or separate fasteners. Also, if a light module 106 should fail, same may be conveniently separated from spine unit 102 and replaced without interruption of the operation of the other light modules 106 of the lighting assembly 100.

Referring to FIGS. 14-17, in another embodiment, a modular lighting assembly 150 is shown, which includes a plurality of light modules 106 substantially identical to those described above in connection with module lighting assembly 100, and further including a plurality of lateral connectors 152 extending between, and connecting, the light modules 106 in the manner described below. The light modules 106 and lateral connectors 152 may be conveniently shipped separate from one another in a disassembled condition, and then assembled and installed at a use location as described below.

Figure 15:
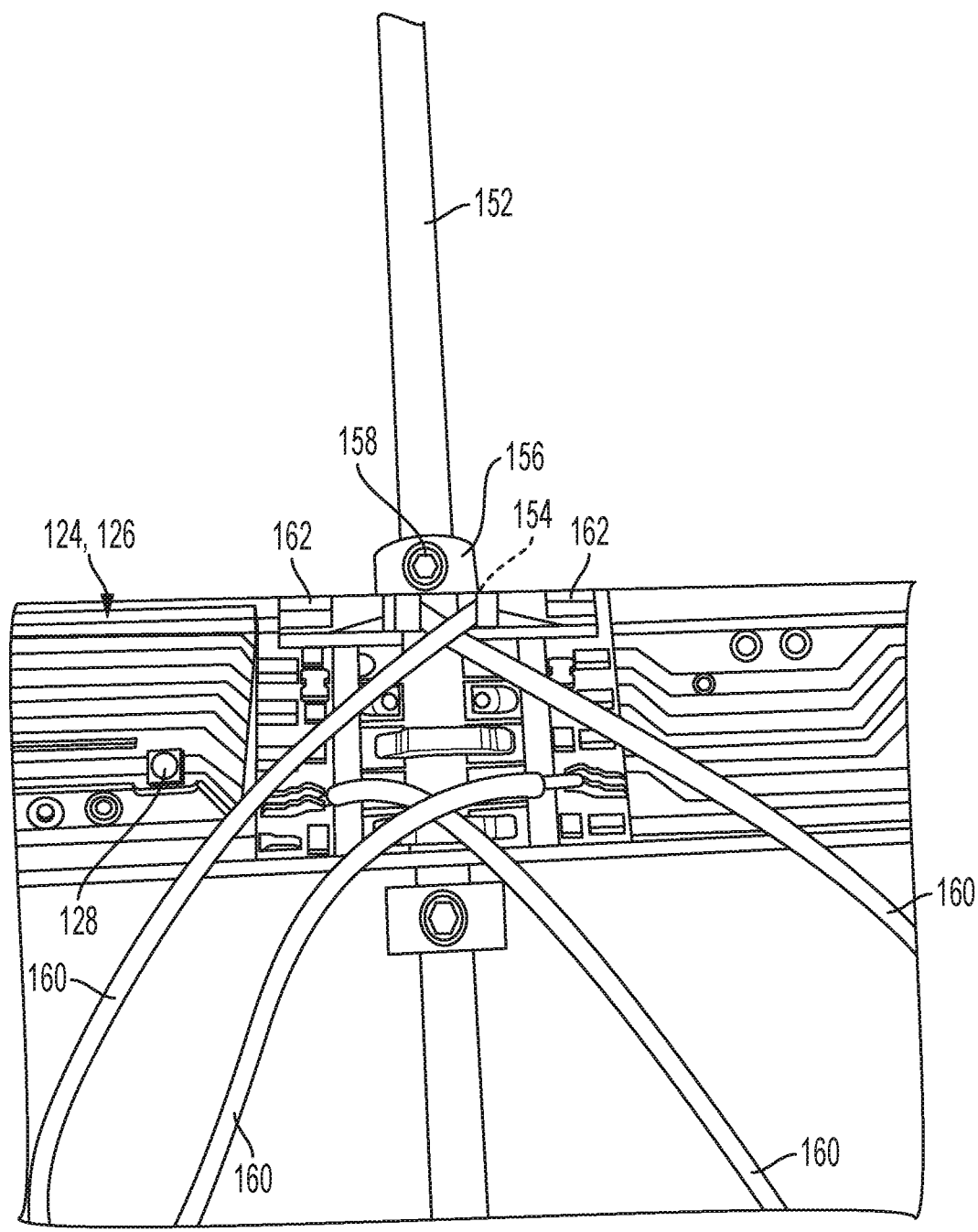
FIG. 15 is a close-up perspective view of the components of FIG. 14.

Referring to FIG. 15, lateral connectors 152 may take the form of elongate rods made of a metal or metal alloy, for example, which extend through lateral bores 154 in light modules 106. A plurality of collars 156 with set screws 158 are adjustably received on lateral connectors 152 for abutting, and thereby fixing the locations of, light modules 102 along lateral connectors 152. Advantageously, lateral connectors 152, when made of a heat conducting material such as a metal or a metal alloy, additionally facilitate the conduction and dissipation of heat away from light modules 106.

Figure 14:
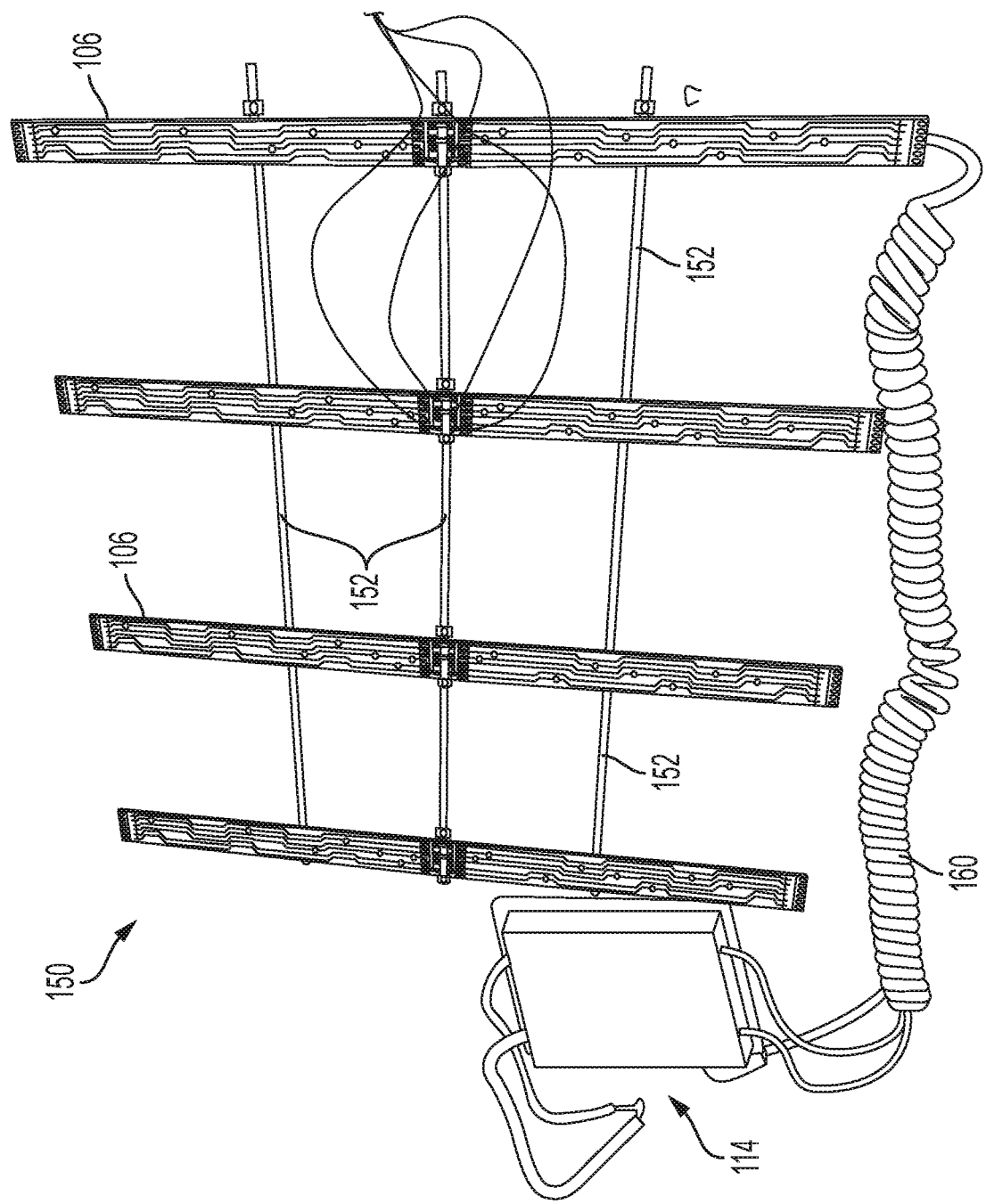
FIG. 14 is a perspective view of components of a modular lighting assembly according to a still further embodiment.

Referring additionally back to FIG. 14, power is supplied to light modules 102 from one or more power supplies 114 via wires 160, which connect to input sockets 162 mounted to light modules 106. Alternatively, wires 160 may be soldered directly to light modules 102. Wires 160 supply electrical power from the power supplies 114 to the electrical circuitry 126 of light modules 102 to power the LED units 128. As shown in FIG. 14, in one embodiment, wires 160 may include a helical wire to enable the power supplies 114 to be selectively mounted to a desired location on a support structure, such as ceiling grid, which is spaced away from lighting assembly 150.

Figure 16:
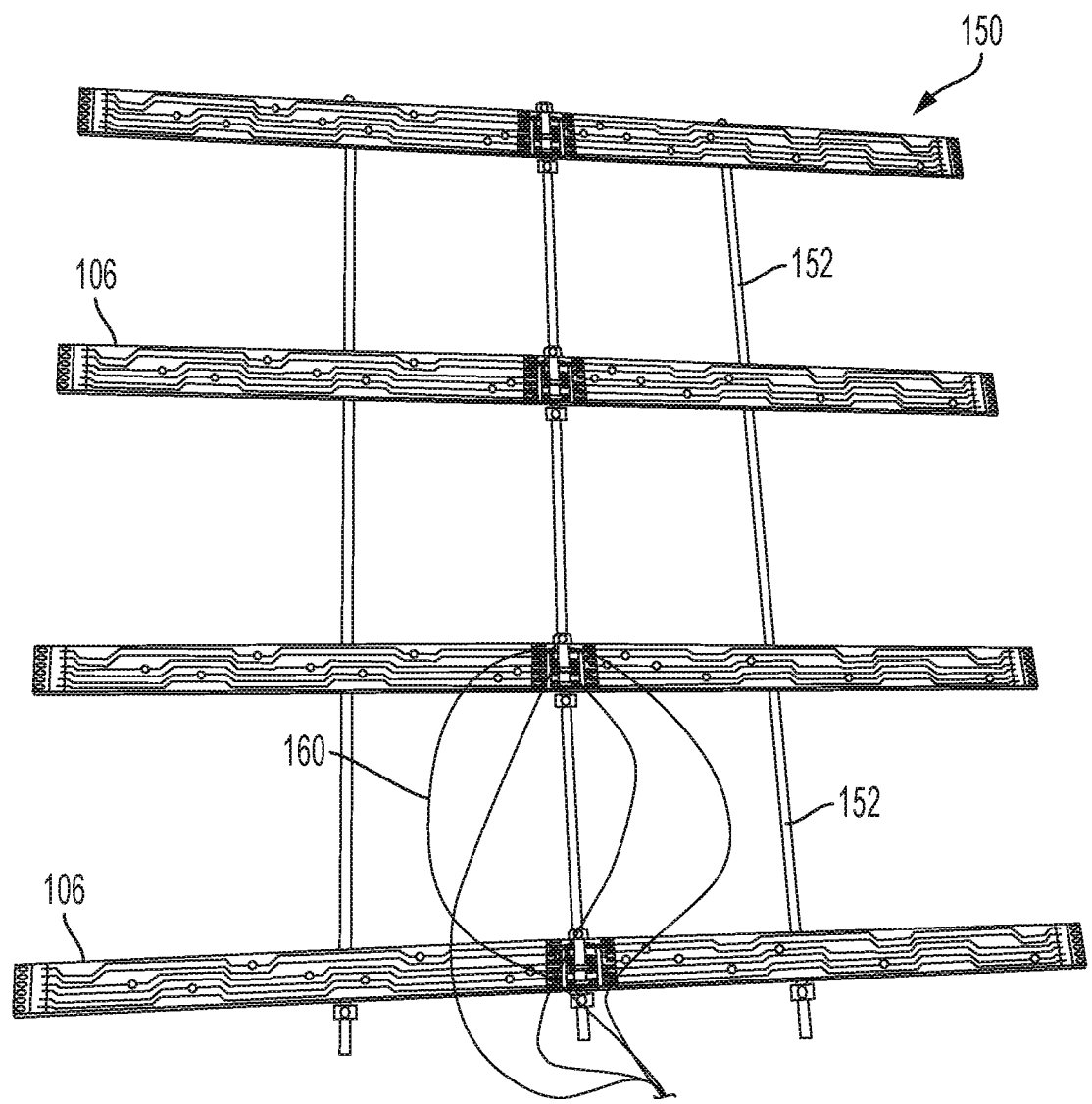
FIG. 16 is another perspective view of the components of the lighting assembly of FIG. 14, with the light modules spaced relatively far apart from one another.
Figure 17:
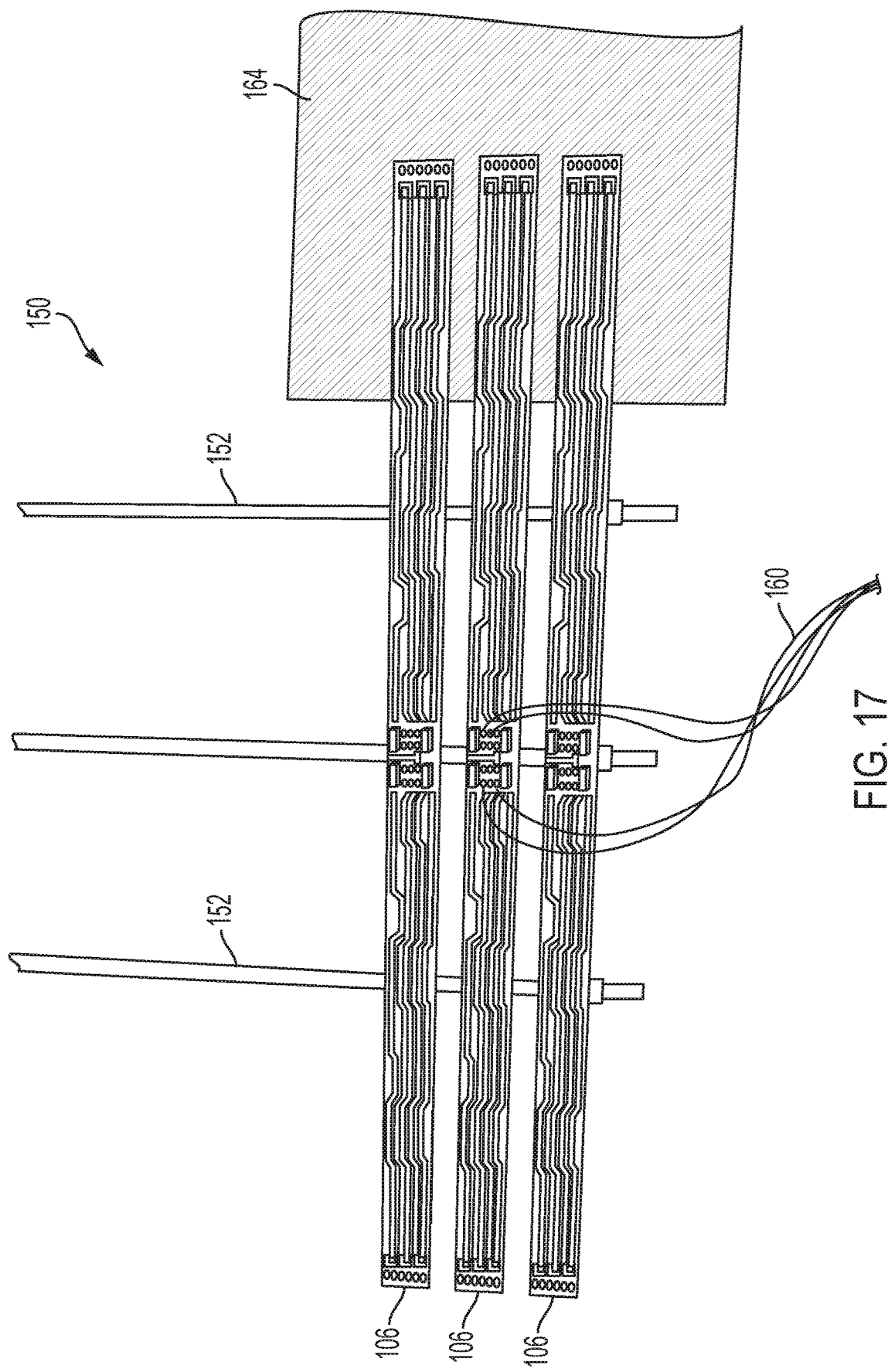
FIG. 17 is another perspective view of the components of the lighting assembly of FIG. 14, with the light modules spaced relatively close to one another.

As shown in FIGS. 14 and 16, light modules 106 are disposed substantially parallel to one another and are spaced from one another along lateral connectors 152 at first, relatively widely spaced interval distances. However, by slidably adjusting the locations of collars 156 and light modules 106 along lateral connectors 152, the spacing between light modules 106 may vary. For example, as shown in FIG. 17, light modules 106 may be disposed substantially parallel to one another and spaced from one another at second, relatively narrowly spaced interval distances such that the light modules 106 are disposed relatively close to one another. In a further embodiment, light modules 106 may also laterally abut one another.

Advantageously, the adjustable connectivity of light modules 106 to lateral connectors 152 allows the spacing between light modules 106 to be set upon installation, and also to be adjusted after installation, depending upon the initial lighting needs of a building space and/or a change in the lighting needs of a building space in which lighting assembly 150 has been installed.

For example, in FIG. 16, with light modules 106 spaced relatively far from one another, a minimum number of light modules may be used to provide supplemental light when lighting assembly 150 is mounted to a glass ceiling of a greenhouse, for example, in order to aid the growth of plants within the greenhouse during cloudy days or otherwise when supplemental light is needed, and yet not significantly block the passage of natural light into the greenhouse.

Referring to FIG. 17, with light modules 106 mounted relatively close to one another, light modules 106 may be used to provide lighting to a lower plant bed (not shown) disposed below light modules 106 when lighting assembly 150 is mounted beneath an upper plant bed 164 in a stacked arrangement of plant beds within a growing space, for example.

Referring to FIGS. 18-21, a further embodiment of a modular lighting assembly is shown, which includes light modules manufactured as described above and, except for the differences discussed below, the light modules may made of substantially the same materials and include electrical circuitry and LED units assembled in accordance with the thick film deposition techniques described in detail above.

Figure 18:
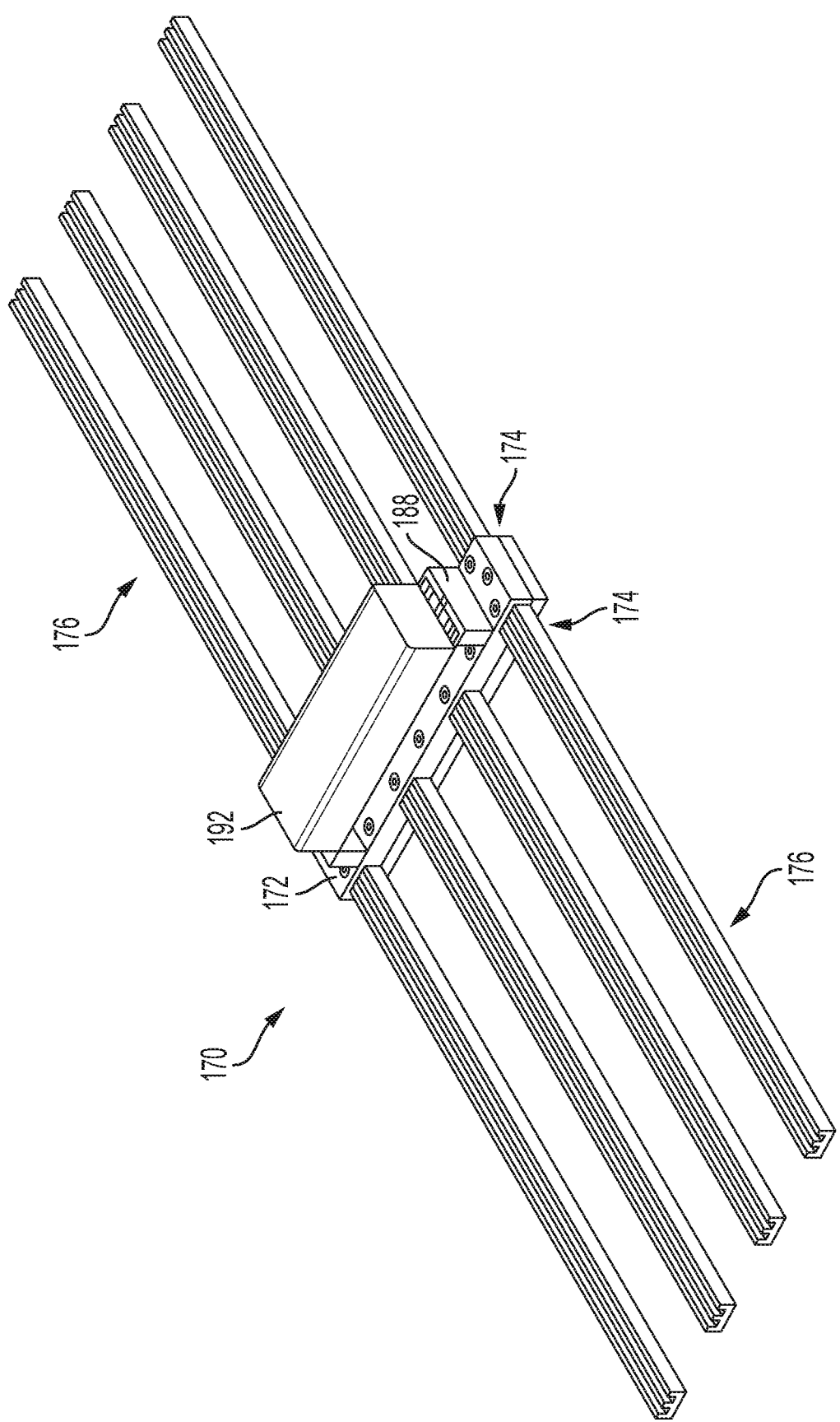
FIG. 18 is a perspective view of components of a modular lighting assembly according to a still further embodiment.
Figure 19:
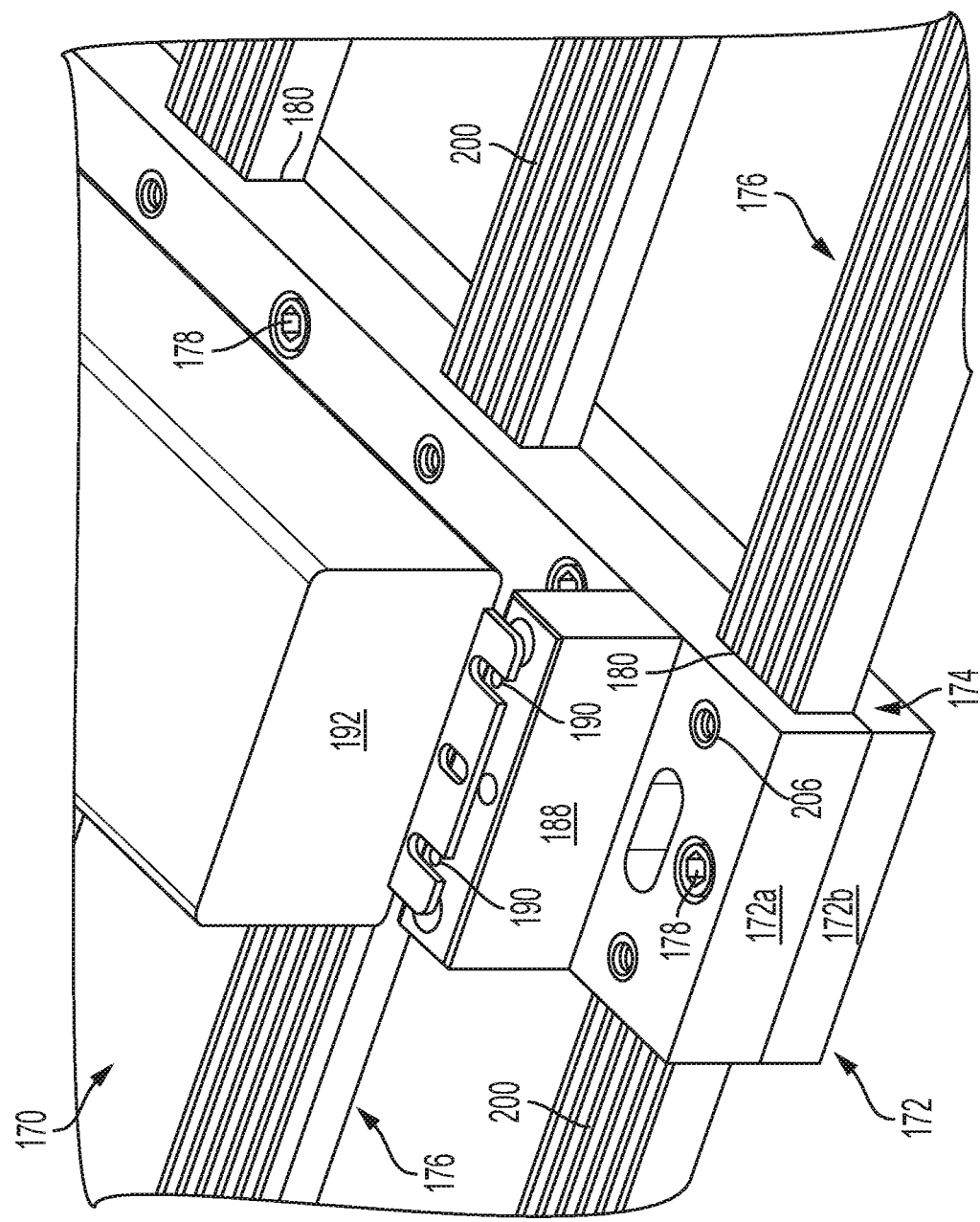
FIG. 19 is fragmentary perspective view of a portion of the modular lighting assembly of FIG. 18.

Referring to FIGS. 18 and 19, modular lighting assembly 170 generally includes one or more elongate spine units 172 having a plurality of connecting interfaces 174, together with a plurality of light modules 176 releasably connectable to the connecting interfaces 174 of the spine units 172 in the manner described below. The spine units 172 may have any cross-sectional shape, and may be shaped to be elongate and straight as shown, or may be in the form of other shapes, such as L-shaped, T-shaped, or X-shaped, for example. The spine units 172 and light modules 176 may be conveniently shipped separate from one another and in a disassembled condition, and then installed at a use location as described below.

The spine units 172 may be formed from an insulating plastic material via extrusion or injection molding, for example, and may be elongate in shape, extending along a longitudinal extent which, as shown in FIGS. 18 and 19, is substantially perpendicular to the orientations of the light modules 176 that are connected to spine units 172. The spine units 172 may be secured to a suitable support structure in an upper portion of an interior building space, or may be integrated into, or otherwise secured to, an existing ceiling grid structure within a building interior space.

Figure 20:
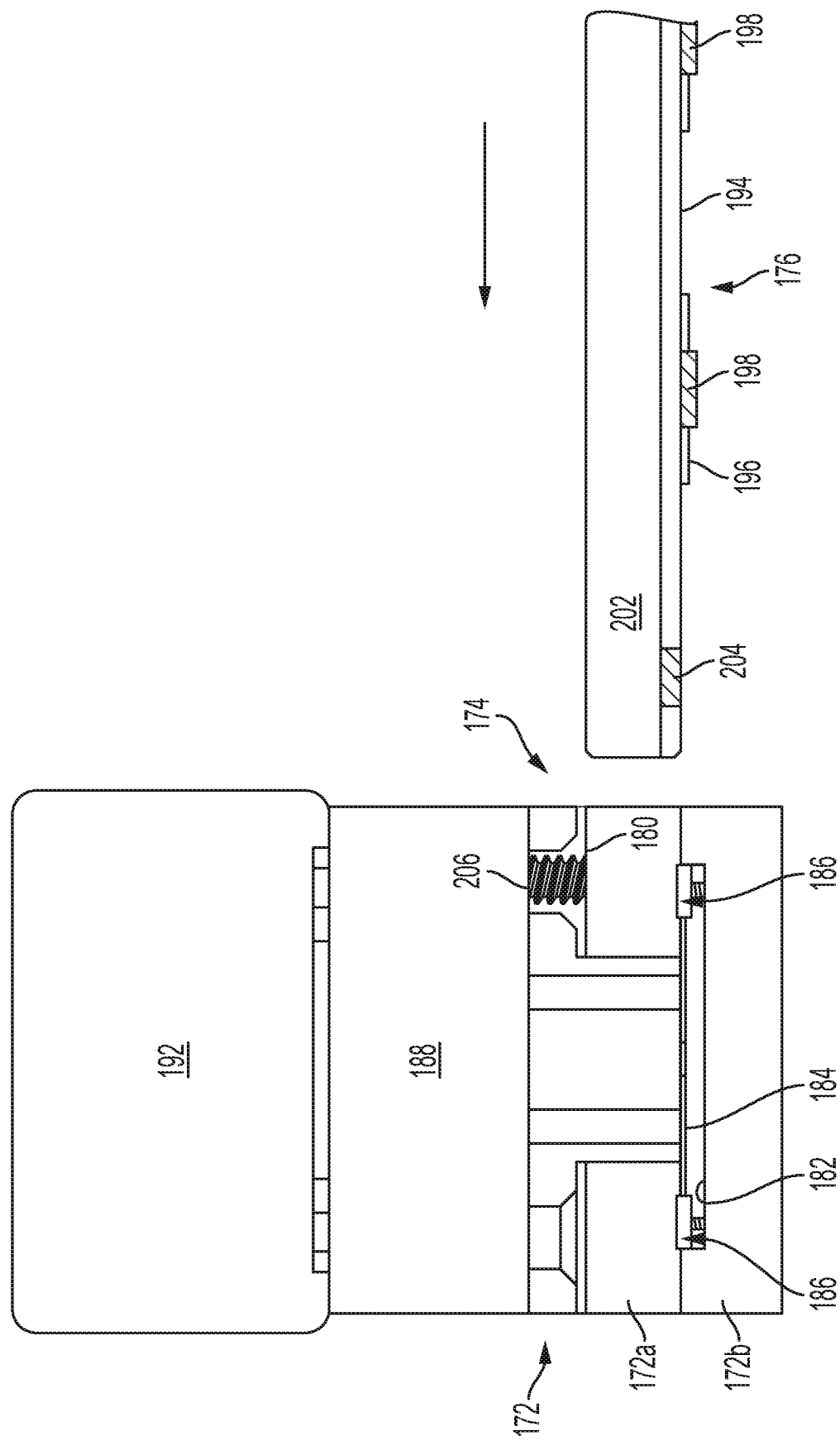
FIG. 20 is a first sectional view through a portion of a spine unit of the lighting assembly, showing insertion of a light module into a connecting interface.
Figure 21:
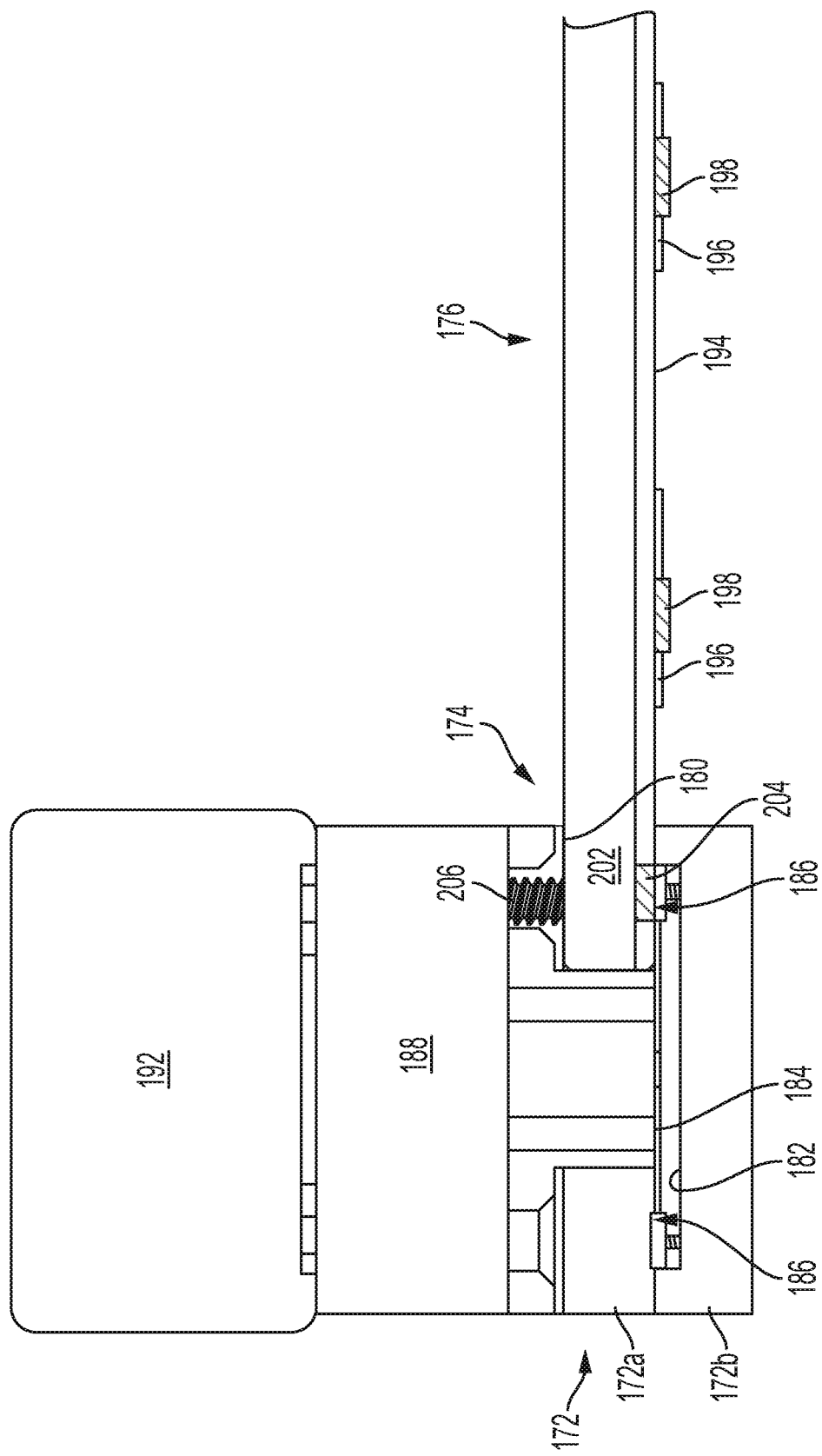
FIG. 21 is a second sectional view through a portion of a spine unit of the lighting assembly, showing a light module secured within the connecting interface.

Referring to FIGS. 19-21, each spine unit 172 may include a pair of first and second housings 172a and 172b formed from an insulating plastic material, for example, which are matingly secured to one another via a plurality of fasteners such as screws 178. Alternatively, or in addition to the foregoing attachment method, first and second housings 172a and 172b may be connected to one another by snap-fit features, either in a releasable manner or a non-releasable manner.

As shown, first housings 172a include recesses 180 which cooperate with second housings 172b to form the connecting interfaces 174 for connecting light modules 176 to spine units 172 in the manner described below. Referring to FIG. 21, second housings 172b may include longitudinal recesses or channels 182 for receiving electrical circuitry 184, together with electrical contacts 186 which may be spring-biased electrical contacts, for example.

Referring to FIG. 19, either of the housings 172a or 172b of spine units 172 may include extensions or standoffs 188 projecting therefrom which include a plurality of connecting interfaces, such as screw-threaded holes 190, for connecting a power supply 192 to spine units via suitable fasteners (not shown) in a manner in which power supply 192 is spaced from spine units 172 to facilitate air flow around power supply 192 for cooling, for example. Power supply 192 may receive power from a building power supply, such as 110 volts AC, and stepping down and/or converting the power to low voltage direct current (DC) to power the LEDs of light modules 176 in the manner described below. Alternatively, power supply may be located remotely from spine unit 172, for example, as shown and described above in connection with the embodiment of FIG. 22.

Light modules 176 may each take the form of an extruded metal or metal alloy substrate, such as aluminum, having a lower surface 194 to which electrical circuitry 196 is applied via the thick film printing techniques described above, for example. Light modules 176 also include a plurality of LED units 198 mounted and connected to the electrical circuitry 196 and spaced along the extent of the length of light modules 176. In this manner, each light module 176 serves several functions, including a substrate onto which electrical circuitry 196 may be printed, a structural support for mounting the LED units 198, and a heat sink for dissipating heat from the LED units 198 into a surrounding environment via heat dissipation fins 200 (FIG. 19) extending from an upper surface of light module 176. Light modules 176 also include end portions 202 having a second set of electrical contacts 204 for mating with, and electrically connecting to, electrical contacts 186 of spine unit 172.

Referring to FIGS. 20 and 21, to connect a light module 176 to a corresponding connecting interface 174 a spine unit 172, the end portion 202 of a light module 176 is laterally inserted into the recess 180 of a connecting interface 174 along the direction of the lateral arrow in FIG. 20 to initially seat end portion 202 of light module 176 within recess 180 and to physically and electrically engage the electrical contacts 204 and 186 of light module 176 and spine unit 172, respectively, with one another to establish an electrical connection therebetween. Thereafter, one or more fasteners may be used to secure or fix light module 176 in place with respect to spine unit 172, such as with set screws 206 extending through housing 172a and into engagement with the upper surface of light module 176.

In this manner, a number of light modules 176 may be quickly and conveniently installed to the connecting interfaces 174 along the sides of spine unit 172 using simple fasteners such as set screws in the manner described above. Also, if a particular light module 176 should fail, same may be conveniently separated from spine unit 172 and replaced without interruption of the operation of the other light modules 176 of the lighting assembly.

In each of the embodiments described above, although the various light modules, such as light modules 20, 106 and 176, may include electrical circuitry and LED units assembled in accordance with the thick film deposition techniques described in detail above, in other embodiments, suitable electrical circuitry and/or LED units may be mounted to the light modules using conventional techniques, such as via direct soldering or with adhesive, for example.

Figure 22:
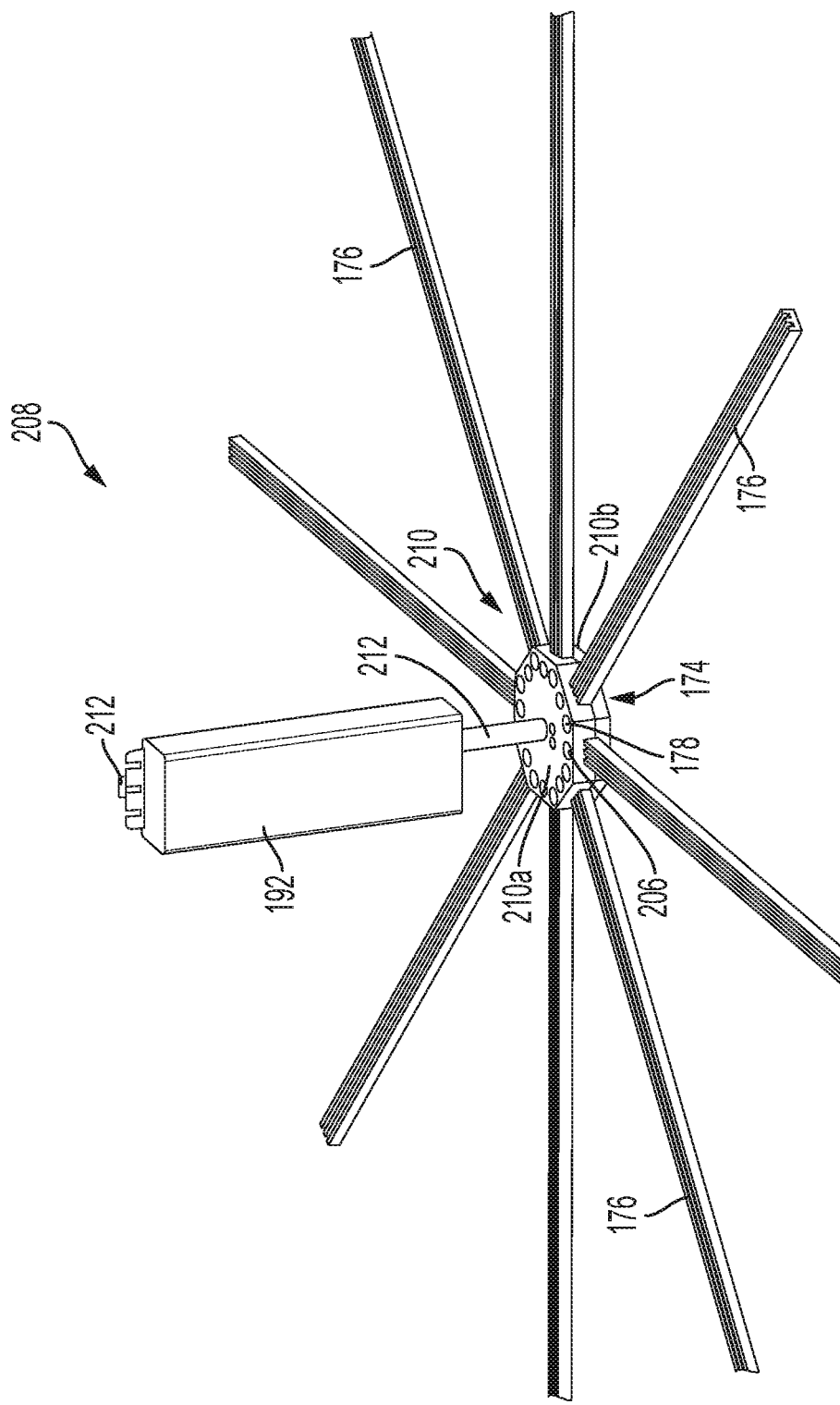
FIG. 22 is a perspective view of components of a modular lighting assembly according to a still further embodiment.

Referring to FIG. 22, a further modular lighting assembly 208 includes light modules 176 that are identical to those described above, for example, in connection with FIGS.

18-21. However, rather than including elongate spine units 172, modular lighting assembly 208 includes spine hubs 210, which include a pair of first and second housings 210a and 210b secured to one another by screws 178 or in a snap-fit manner. Spine hubs 210 are structurally similar to first and second housings 172a and 172b of spine units 172 described above in connection with FIGS. 18-21, except that spine hubs 210 have a generally round shape which may be circular or polygonal, such as octagonal as shown in FIG. 21. Light modules 176 are releasably connectable to connecting interfaces 174 of spine hubs in the same manner as described above in connection with FIGS. 18-21, with light modules 176 disposed in a generally circular array radiating outwardly from their respective spine hub 210 similar to spokes of a wheel. Each spine hub 210 further includes a conduit post 212 through which wiring is routed from an external source to a power supply 192 mounted to conduit post 212, and thence from power supply 192 to light modules 176 as described above. Conduit post 212 may be integrated into, attached to, or otherwise suspended from the ceiling structure of an interior building space, for example. Advantageously, modules 176 may be quickly and conveniently installed to spine hubs in the same manner as set forth above in connection to the embodiments of FIGS. 18-21.

Further, each of the light modules disclosed herein, regardless of whether the light modules include electrical circuitry and LED units assembled in accordance with the thick film deposition techniques described above, or whether the light modules include LED units directly secured to the light module via direct soldering or adhesive, for example, may include optional auxiliary heat dissipation structures, as described below.

Figure 23:
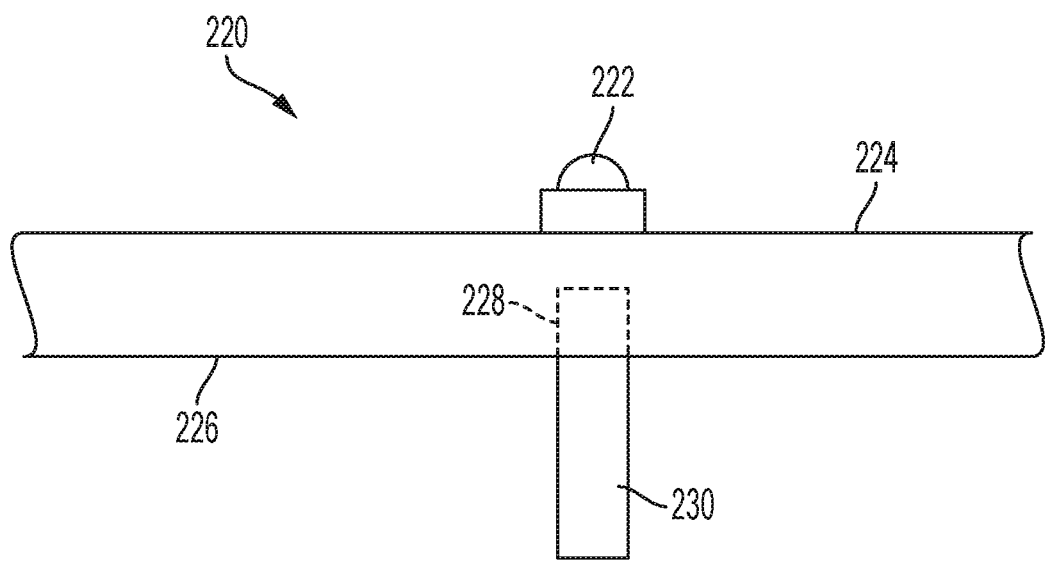
FIG. 23 is a view of a portion of a light module including an auxiliary heat dissipation member.

For example, referring to FIG. 23, a portion of a light module is 220 is shown, which may be identical to any of the light modules 20, 106, or 176 previously described above, except for the differences set forth below. Light module 220 includes an aluminum or aluminum alloy extrusion or other heat conductive, metallic substrate having one or more LED units 222 mounted to its front side 224, either in accordance with the thick film deposition techniques described above, or via direct securement via soldering or adhesive, for example. On a rear side 226 of light module 220, same may include a recess or cavity 228 into which an auxiliary heat dissipation member 230, such as a fin, pin, cone, blade, or peg, for example, may be inserted. Heat dissipation member 230 may be made of the same material as light module 220, such as an aluminum or aluminum alloy or other heat conductive, metallic material. Advantageously, if heat dissipation member 230 is made of a heat conductive material identical to that of light module 220, such may facilitate a very efficient heat transfer therebetween which, as described below, is based on the direct, conductive, metal-to-metal contact between light module 220 and heat dissipation member 230.

Heat dissipation member 230 may be press-fit into recess 228 according to a conforming, metal-to-metal, direct contacting fit with little or no air gap being present between heat dissipation member 230 and recess 228. For example, heat dissipation member 230 may be inserted into recess 228 via a press-fit that may involve material cold flow and/or material diffusion between heat dissipation member 230 and light module 220 to ensure an integrated fit, similar to a welded contact, in order to facilitate efficient heat transfer. In other embodiments, heat dissipation member 330 may be threadingly inserted into recess 228 via a threaded connection.

Typically, heat dissipation member 230 may be located on rear side 226 of light module 220 in an area either directly opposed to, or very closely proximate to, the location of LED unit 222 on the opposite, front side 224 of light module 220 for efficient, conductive heat transfer. Multiple heat dissipation members 230 may be used, both immediately opposite and in the vicinity of LED unit 222. Although it may be preferable to locate heat dissipation members 230 on rear side 226 of light module 220 opposite LED units 222 to minimize any potential interference with the lighting from the LED units 222, heat dissipation members 230 may also be located on the front side 224 of light module 220.

Advantageously, the close fitting contact between heat dissipation member 230 and light module 220 without the presence of an air gap facilitates efficient heat transfer therebetween though, optionally, a thin layer of a metal-bearing material, such as a silver paste, may be used at the interface of heat dissipation member 230 and recess 228 of light module 220. This optional, thin layer of material may have a heat conductively of at least 400 W/mK or greater, for example, and may not be needed for adhesive purposes to secure heat transfer member 230 to light module 220, but rather to eliminate any potential air gaps that may be present therebetween.

In this manner, the interface between heat transfer member 230 and light module 220 may lack the need for placement between heat transfer member 230 and light module 220 of a dedicated thermal interface material (TIM) of a traditional type which is formulated with a polymer matrix filled with metallic heat transfer particles and optionally, a phase change material, for example.

Figure 24:
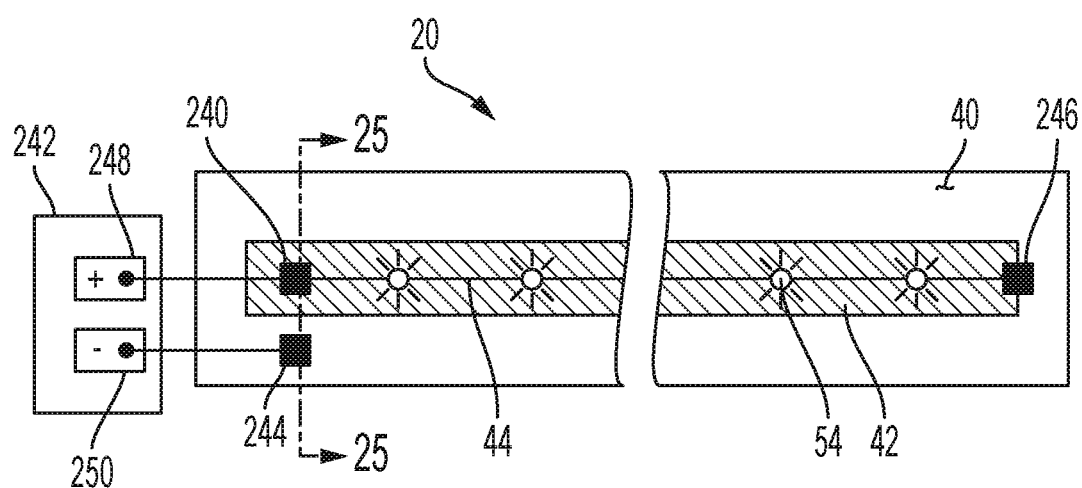
FIG. 24 is a top view of a light module according to a further embodiment
Figure 25:
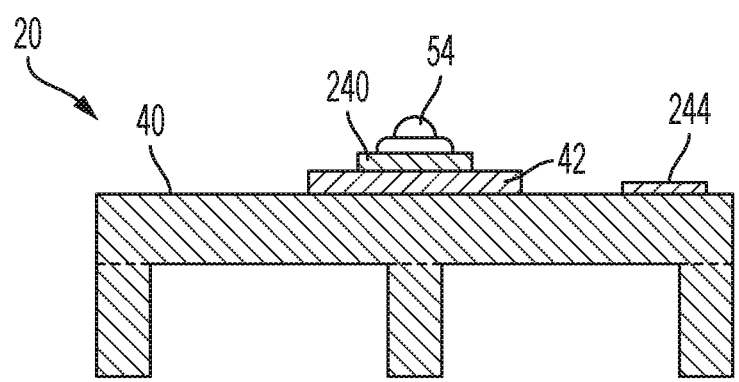
FIG. 25 is a sectional view of the light module of FIG. 24.

Referring to FIGS. 24 and 25, a further embodiment and method according to the present disclosure is shown in which light module 20 itself, i.e., the electrically conductive body or substrate of light module 20, may be used as either a supply path or return path for electrical current in order to increase the overall electrical efficiency of the light module 20 and the brightness of the LED units 54. In FIGS. 24 and 25, the same reference numerals will be used to identify identical or substantially identical components with respect to previous embodiments.

Referring to FIG. 24, deposition surface 40 of light module 20 may include insulating layer 42 deposited on less than an entire exposed surface area of deposition surface 40. In this manner, at least a portion of deposition surface 40 may remain exposed and uncovered by insulating layer or any other layer or covering. In one embodiment, insulating layer 42 is deposited over as little as 10%, 20% or 30%, or as great as 50%, 60% or 70%, for example, of the entire surface area of deposition surface 40, or within any range defined between any two of the foregoing values. Advantageously, as discussed further below, depositing insulating layer 42 onto deposition surface 40 in this manner requires the use of less material for insulating layer 42 and decreases the chances of any potential defects in insulating layer 42 adversely affecting the operation of light module 20. A circuit layer 44 may be deposited on insulating layer 42, and a plurality of LED units 54 may be mounted to the exposed side of insulating layer 42 and/or circuit layer 44 in the manner described in connection with previous embodiments.

A first electrical contact 240, made of silver, copper, or any other electrically conductive material, may be deposited or secured to the exposed side of insulating layer 42, and is in electrical contact with both a power source 242 and with circuit layer 44. A second electrical contact 244, also made of silver, copper, or any other electrically conductive material, may be mounted to the exposed deposition surface 40, and is in electrical contact with both the power source 242 and with the electrically conductive substrate or body of light module 20. A third electrical contact 246, also made of silver, copper, or any other electrically conductive material, may be mounted in a bridging manner between insulating layer 42 and the exposed deposition surface 40 wherein the third electrical contact 246 electrically connects circuit layer 44 with the exposed deposition surface 40 of electrically conductive substrate or body of light module 20. Power source 242 includes an anode 248 and a cathode 250 for supplying power to light module 20 in the manner described below.

As may be seen from FIG. 24, first and second electrical contacts 240 and 244 are disposed proximate one end of light module 20, and third electrical contact 246 is disposed proximate a second, opposite end of light module 20. First electrical contact 240 is electrically connected to anode 248 or cathode 250 of power source 242, and second electrical contact 244 is electrically connected to the other of anode 248 and cathode 250 of power source 242 to form an electrical circuit through light module 20 for powering LED units 54 in the manner described below.

In one embodiment, first electrical contact 240 is connected to anode 248, such that electric current flows sequentially from anode 248 of power source 242 to light module 20 through first electrical contact 240, then through circuit layer 44 to power LED units 54, then through third electrical contact 246 into the substrate or body of light module 20, then through second electrical contact 244 to depart light module 20 to cathode 250 of power source 242. In this manner, electrical current is supplied to LED units 54 from power source 242 through circuit layer 44 and returns to power source 242 through the substrate or body of light module 20.

In another embodiment, the foregoing arrangement is reversed. In this embodiment, second electrical contact 244 is connected to anode 248, such that electric current flows sequentially from anode 248 of power source 242 to light module 20 through second electrical contact 244, then through the substrate or body of light module 20, then through third electrical contact 246, then through circuit layer 44 to power LED units 54, and then through first electrical contact 240 to depart light module 20 to cathode 248 of power source 242. In this manner, electrical current is supplied to LED units 54 from power source 242 through the substrate or body of light module 20 and then through circuit layer 44 before returning to power source 242.

In this manner, the substrate or body of light module 20 is itself used to form part of the electric circuit through which LED units 54 are powered, greatly increasing the overall efficiency of the power supply to LED units 54 by obviating the need for a dedicated circuit layer 44 and associated electrical circuitry by which either a supply or return path of electrical current to or from LED units 54 would otherwise be necessary. Additionally, obviating the need for such a dedicated electrical circuit layer 44 also reduces the amount of material and size of insulating layer which would otherwise be needed to electrically insulate the return or supply electrical layer 44 from the substrate.

Figure 26:
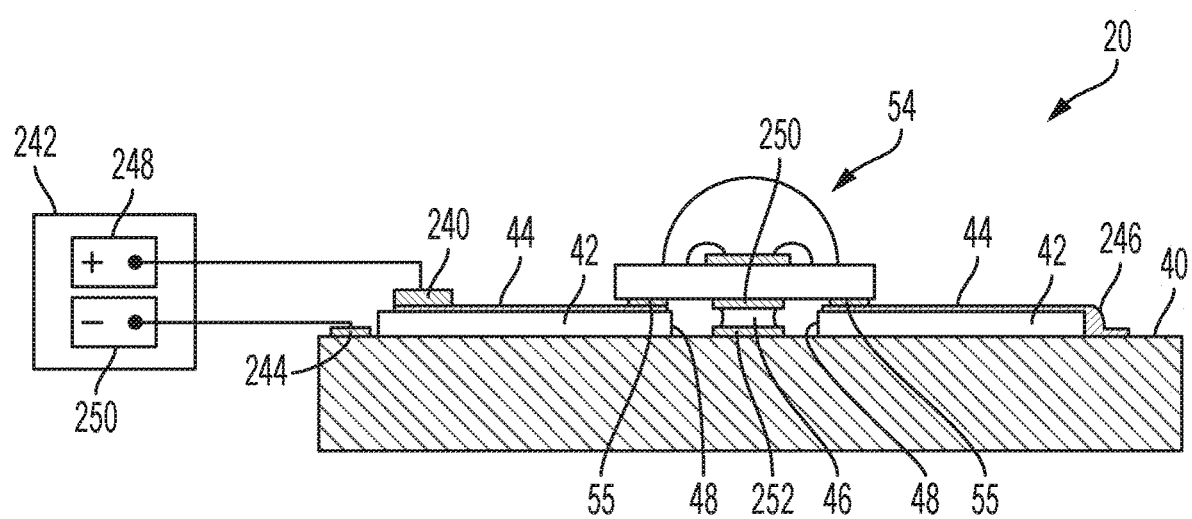
FIG. 26 is a further sectional view of the light module of FIG. 24 according to an alternate embodiment.

Referring to FIG. 26, another embodiment of light module 20 is shown which, except as described below, is similar to that shown in FIGS. 24 and 25 above. Light module 20 includes one or more thermal vias 46 of the type shown and described above in connection with the embodiments of FIGS. 5A and 5B, which may be provided within spaces or openings 48 in insulating layer 42 and/or circuit layer 44. Thermal vias 46 may be formed of a heat conductive material which is electrically isolated from its respective LED unit 54, such as an electrically isolated but solderable metal pad which is connected to the backside of its respective LED unit 54 via solder connection 250 and is connected to the substrate of light module 20 via thermally conductive bonding such as via a silver bond pad 252, for example, such that thermal vias 46 are electrically isolated from circuit layer 44 and the electrical supply of LED units 54.

LED units 54 are also connected via positive and negative electrical connections (not shown) in each LED unit 54 to electrical circuit layer 44 via solder layers 55, and are powered from power source 242 as described above in connection with the embodiment of FIGS. 24 and 25. In use, thermal vias 48 conduct heat from the backsides of LED units 54 directly to the substrate of light module 20 to aid in heat dissipation from LED units 54.

Referring to FIGS. 27-31B, a modular lighting assembly 300 is shown in connection with a further embodiment which employs features discussed herein, including light modules for powering LED units and having insulating and circuit layers produced via thick film printing techniques, an assembly including a central spine unit to which a plurality of individual light modules may be releasably connected, and use of metallic components, such as the metallic substrate of a light module, for directly conducting current to power a plurality of LED units.

Figure 27:
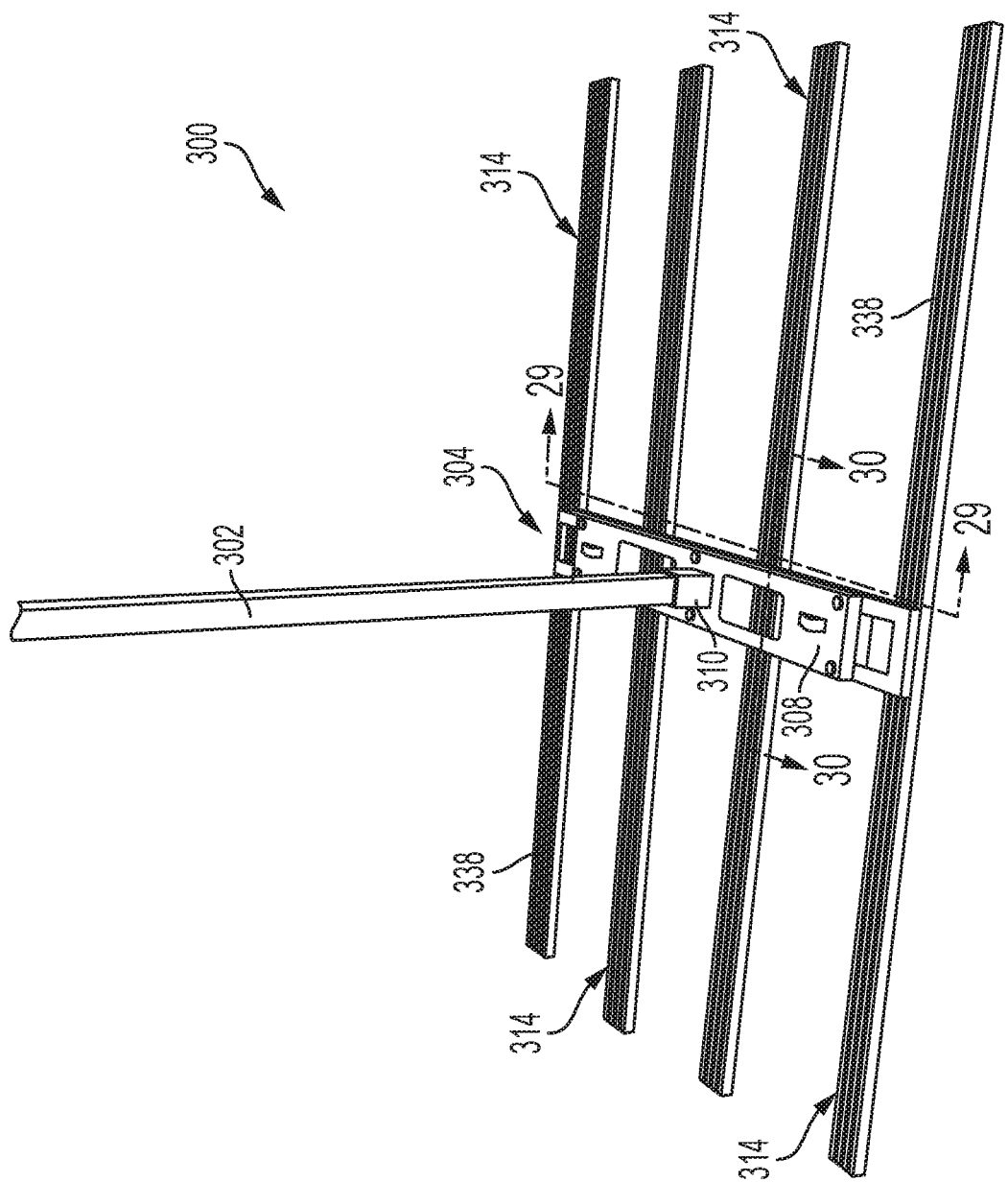
FIG. 27 is a perspective view of a modular lighting assembly according to a further embodiment.

Referring to FIG. 27, modular lighting assembly 300 is shown, which generally includes a substantially vertical support post 302 for mounting assembly 300 to existing building architecture, such as a ceiling framework, a wall framework or an existing lighting fitting in a ceiling or wall. Support post 302 houses electrical wiring therein (not shown) for supplying power to assembly 300 from a power source in the building to a spine unit 304 supported by support post 302. The power supplied to spine unit 304 may be DC power or may be AC power which is converted to DC power via a convertor (not shown) associated with support post 302 and/or spine unit 304.

Spine unit 304 may be mounted to support post 302 in a releasable manner, such as via fasteners or a press-fit, for example. Referring additionally to FIGS. 29 and 30, spine unit 304 is similar to those shown in FIGS. 9-13 and 19-22 herein, and generally includes an elongated central body 306 made of an electrically non-conductive plastics material, for example. A plastic cover 308 is secured to body 306 and includes a mounting interface, such as hub 310 for receiving support post 302 for mounting spine unit 304 to support post 302. Cover 308 may also include other mounting interfaces for mounting spine unit 304 to existing building architecture, for example, for mounting spine unit 304 directly to the ceiling framework of a building.

As best shown in FIGS. 29 and 30, body 306 of spine unit 304 generally includes a series of connecting interfaces, shown as cavities 312 in which light modules 314 are received. A bus bar or cover strip 316, made of a conductive metal such as aluminum, is secured to the underside of body 306 via suitable fasteners 318 (FIG. 30) to retain light modules 314 within cavities 312 of body 306 with light modules 314 extending outwardly from one or both sides of body 306, as shown in FIG. 27. Referring to FIG. 30, fasteners 318 may also function to secure the several components of spine unit 304 together, including body 306, cover 308, light modules 314, and bus bar 316.

Figure 28:
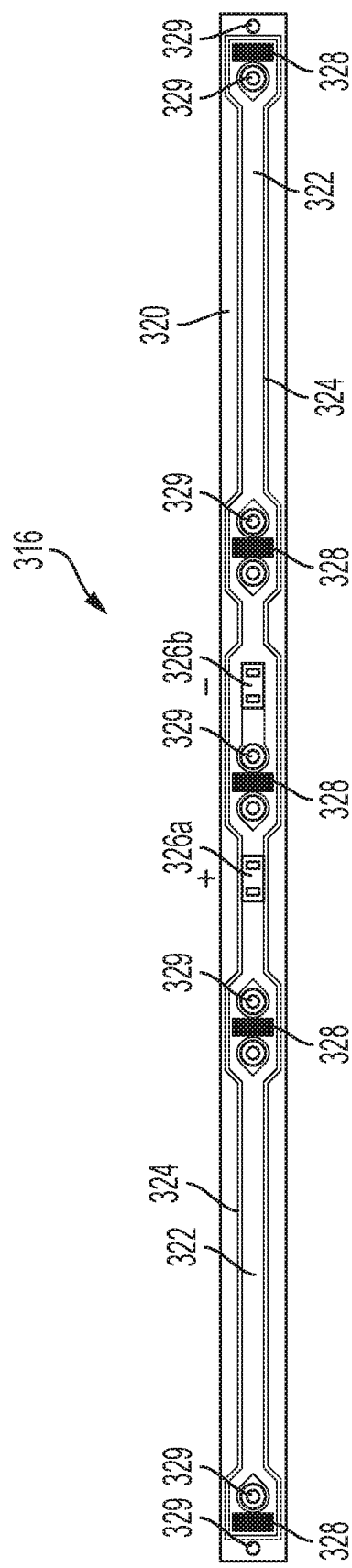
FIG. 28 is a bottom view of a bus bar of the lighting assembly of FIG. 27.

Referring to FIG. 28, bus bar 316 includes an upper surface 320 which, in use, faces body 306 of spine unit 304. Upper surface 320 includes an insulation layer 322 printed thereon in accordance the materials and thick film printing techniques described herein. A circuit layer 324 is printed on insulation layer 322, also in accordance with the materials and thick film printing techniques described herein. A pair of surface-mounted electrical connectors 326a and 326b are mounted to upper surface 320 of bus bar, wherein one connector 326a/326b is a positive connector and the other connector 326a/326b is a negative connector. Connectors 326a/326b receive DC electrical current routed through support post 302 and spine unit 304 via suitable wiring (not shown). As shown, connector 326a is a positive connector electrically connected to circuit layer 324 of bus bar 316 and connector 326b is a negative connector electrically connected directly to the metal substrate of bus bar 316. However, the foregoing configuration may be optionally reversed.

As shown in FIG. 28, bus bar 316 also includes a series of exposed electrical contacts 328, made of an electrically conductive material such as silver, for example and which, is described below, are in electrical contact with corresponding light modules 314. Bus bar 316 further includes sets of apertures 329 disposed proximate contacts 328 for receipt of fasteners 330 which, as shown in FIG. 29, engage the substrates of light modules 314 and capture light modules 314 within cavities 312 of spine unit 304. Fasteners 330 are made of an electrically conductive metallic material for conducting electric current therethrough, as further described below.

Referring to FIGS. 31A and 31B, the lower side of a light module 314 is shown. Light modules 314 are manufactured similar to the other light modules discussed herein based on thick film printing techniques and materials, and generally include an electrically conductive substrate 332, such as aluminum, having a lower surface 334 on which an insulation layer 336 is printed in accordance the materials and thick film printing techniques described herein. On its opposite side, each light module 314 includes a plurality of fins 338 (FIG. 27) for dissipating heat. An electrical circuit layer 340 is printed on insulation layer 336 in accordance the materials and thick film printing techniques described herein, and a plurality of LED units 342 are mounted to each light module 314 in electrical contact with electrical circuit layer 340. As shown in FIGS. 31A and 31B, each light module 314 includes a pair of electrical circuit layers 340, one on each side of the length of light module 314, which are an electrical connection with one another via a jumper contact 344, with jumper contact 344 also in electrical contact with contacts 328 of bus bar 316. Light modules 314 also include metallic substrate connectors 346 electrically connecting circuit layer 340 directly to the metallic substrates 332 of light modules 314. In the configuration shown in FIGS. 31A and 31B, LED units 342 are arranged in groupings of six units, with four such groupings on each side of jumper contact 344, with each grouping of LED units 342 including an associated metallic substrate connector 346.

In the described above, light modules 314 are selectively attached to spine unit 304 in a modular manner, wherein a user may select the number of light modules 314 desired for connection to spine unit 304 depending on the lighting requirements of a given location. Additionally, light modules 314 may have a variable length as well as a variable number of LED units 342 mounted thereto depending on the lighting needs of the location, and light modules 314 may be formed as elongate, single piece elements which span spine unit 304 to extend from opposite side of spine unit 304 or alternatively, light modules 314 may be formed as separate components separately attached to opposite sides of spine unit 304 similar to the embodiments shown in FIGS. 9-13 and 18-22 herein.

In operation, referring to FIGS. 27-31B, electrical power is provided from a source in the building, is converted from AC to DC current, then being routed via suitable wiring (not shown) though spine unit 304 to the positive connector 326a of bus bar 316. The current then passes through circuit layer 324 of bus bar 316 to electrical contacts 328 of bus bar 316 and thence to jumper contacts 344 of light modules 314. From the jumper contacts 344 of light modules 314, the current passes through circuit layer 340 of light modules 314 to power the LED units 342 and, from the LED units, the current passes to substrate connectors 346 in circuit layer 340 which are in electrical contact with metallic substrate 332 of light modules 314. The current then passes through the metallic substrates 332 of light modules 314 to metallic fasteners 330 and through fasteners 330 to bus bar 316. Finally, the current passes through bus bar 316 to negative connector 326b of bus bar 316 and then through the wiring of spine unit 304 and support post 302 to the building source to complete the circuit As used herein, the phrase "within any range defined between any two of the foregoing" literally means that any range may be selected from any two of the values, temperatures, etc., listed prior to such phrase regardless of whether the values are in the lower part of the listing or in the higher part of the listing. For example, a pair of values may be selected from two lower values, two higher values, or a lower value and a higher value.

While this disclosure has been described as having exemplary designs, the present disclosure can be further modified within the spirit and scope of this disclosure. This application is therefore intended to cover any variations, uses, or adaptations of the disclosure using its general principles. Further, this application is intended to cover such departures from the present disclosure as come within known or customary practice in the art to which this disclosure pertains and which fall within the limits of the appended claims.

What is claimed is:

1. A modular lighting assembly, comprising:
   an elongate spine unit electrically connected to a source of electric current and having a plurality of connecting interfaces;
   a light module releasably connected to a connecting interface of the spine unit, the light module comprising:
      an elongate metallic substrate;
      an electrically insulating layer deposited on the substrate;
      an electrically conductive circuit layer deposited on the insulating layer; and
      a plurality of LED units electrically connected to the circuit layer; and
   a bus bar connected to the spine unit and including a metallic substrate in electrical contact with the source of electric current and with the circuit layer of the light module;
      wherein the light module further comprises:
         a first electrical contact in electrical contact with the light module circuit layer; a second electrical contact in electrical contact with the light module substrate and with the bus bar substrate; and
         a third electrical contact electrically connecting the light module circuit layer to the light module substrate; and
      wherein the bus bar further comprises:
         an electrically insulating layer deposited on the bus bar substrate;

an electrically conductive circuit layer deposited on the insulating layer;
a first electrical connector in electrical contact with the source of electric current and with the bus bar circuit layer; and
a second electrical connector in electrical contact with the metallic bus bar substrate and with the second electrical contact of the light module; and
wherein electric current from the source supplied through one of the first and second bus bar electrical connectors to one of the first and second light module electrical contacts passes sequentially through one of the light module circuit layer and the light module substrate, though the third electrical contact, through the other of the light module circuit layer and the light module substrate to the other of the first and second light module electrical contacts, and to the other of the first and second electrical connectors for powering the plurality of LED units.

2. The modular lighting assembly of claim 1, wherein the second electrical contact is a metallic fastener directly connecting the bus bar substrate to the light module substrate.

3. The modular lighting assembly of claim 1, wherein electric current from the source supplied through the first bus bar electrical connector to the first light module electrical contact passes sequentially through the light module circuit layer to power the plurality of LED units, though the third electrical contact, through the light module substrate, to the second light module electrical contact, and to the second electrical connector.

4. The modular lighting assembly of claim 1, wherein the connecting interface is formed as a cavity in the spine unit, and the bus bar is fastened to the spine unit to capture the light module within the cavity between the spine unit and the bus bar.

5. The modular lighting assembly of claim 1, wherein the insulating layer and the circuit layer of the light module each have a thickness of between 5 and 100 microns.

6. The modular lighting assembly of claim 1, wherein the light module substrate is formed of a metallic, heat conductive material having a heat conductivity of at least 150 W/m-K.

7. The modular lighting assembly of claim 1, wherein the light module substrate is formed of aluminum or an aluminum alloy.

8. The modular lighting assembly of claim 1, further comprising a thermal via associated with each LED unit, the thermal vias formed of a heat conductive material and extending through respective openings in the light module insulating layer, the thermal vias in heat conductive contact with the LED units and the light module substrate.

9. A modular lighting assembly, comprising:
an elongate spine unit electrically connected to a source of electric current and having a plurality of connecting interfaces;
a bus bar connected to the spine unit, the bus bar comprising:
a metallic substrate;
an electrically insulating layer deposited on the substrate;
an electrically conductive circuit layer deposited on the insulating layer and in electrical contact with the source of electric current; and
a light module releasably retained to the spine unit by the bus bar, the light module comprising:
an elongate metallic substrate in electrical contact with the bus bar circuit layer; and
a plurality of LED units mounted to the light module and in electrical contract with the light module substrate;
an electrically insulating layer deposited on the light module substrate;
an electrically conductive circuit layer deposited on the insulating layer;
a first electrical contact in electrical contact with the light module circuit layer;
a second electrical contact in electrical contact with the light module substrate and with the bus bar substrate; and
a third electrical contact connecting the light module circuit layer to the light module substrate; and
wherein the bus bar further comprises:
a first electrical connector in electrical contact with the source of electric current and with the bus bar circuit layer; and
a second electrical connector in electrical contact with the metallic bus bar substrate and with the second electrical contact of the light module; and
wherein electric current from the source supplied through one of the first and second bus bar electrical connectors to one of the first and second light module electrical contacts passes sequentially through one of the light module circuit layer and the light module substrate, though the third electrical contact, through the other of the light module circuit layer and the light module substrate to the other of the first and second light module electrical contacts, and to the other of the first and second electrical connectors for powering the plurality of LED units.

10. The modular lighting assembly of claim 9, second electrical contact is a metallic fastener directly connecting the bus bar substrate to the light module substrate.

11. The modular lighting assembly of claim 9, wherein electric current from the source supplied through the first bus bar electrical connector to the first light module electrical contact passes sequentially through the light module circuit layer to power the plurality of LED units, though the third electrical contact, through the light module substrate, to the second light module electrical contact, and to the second electrical connector.

12. The modular lighting assembly of claim 9, wherein the connecting interface is formed as a cavity in the spine unit, and the bus bar is fastened to the spine unit to capture the light module within the cavity between the spine unit and the bus bar.

13. The modular lighting assembly of claim 9, wherein the insulating layer and the circuit layer of the light module each have a thickness of between 5 and 100 microns.

14. The modular lighting assembly of claim 9, wherein the light module substrate is formed of a metallic, heat conductive material having a heat conductivity of at least 150 W/m-K.

15. The modular lighting assembly of claim 9, wherein the light module substrate is formed of aluminum or an aluminum alloy.

* * * * *